US011161857B2

(12) United States Patent
Gordon et al.

(10) Patent No.: US 11,161,857 B2
(45) Date of Patent: Nov. 2, 2021

(54) METAL BICYCLIC AMIDINATES

(71) Applicant: President and Fellows of Harvard College, Cambridge, MA (US)

(72) Inventors: Roy Gerald Gordon, Cambridge, MA (US); Eugene Beh, Portola Valley, CA (US); Liuchuan Tong, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 561 days.

(21) Appl. No.: 15/937,507

(22) Filed: Mar. 27, 2018

(65) Prior Publication Data
US 2018/0273550 A1    Sep. 27, 2018

Related U.S. Application Data

(60) Provisional application No. 62/477,205, filed on Mar. 27, 2017.

(51) Int. Cl.
*A61K 9/00* (2006.01)
*C07F 1/00* (2006.01)
(Continued)

(52) U.S. Cl.
CPC .................. *C07F 1/00* (2013.01); *C07F 1/08* (2013.01); *C07F 3/003* (2013.01); *C07F 3/02* (2013.01);
(Continued)

(58) Field of Classification Search
CPC .......................................................... C07F 1/00
See application file for complete search history.

(56) References Cited

FOREIGN PATENT DOCUMENTS

WO    WO-2004/046417 A2    6/2004

OTHER PUBLICATIONS

Edelman, Chapter Two—Recent Progress in the Chemistry of Metal Amidinates and Guanidinates: Syntheses, Catalysis and Materials, Advances in Organometallic Chemistry, 2013, 61, 55-374.*

(Continued)

*Primary Examiner* — Paul W Dickinson
(74) *Attorney, Agent, or Firm* — Wilmer Cutler Pickering Hale and Dorr LLP

(57) ABSTRACT

Compounds are synthesized with bicyclic amidinate ligands attached to one or more metal atoms. These compounds are useful for the synthesis of materials containing metals. Examples include pure metals, metal alloys, metal oxides, metal nitrides, metal phosphides, metal sulfides, metal selenides, metal tellurides, metal borides, metal carbides, metal silicides and metal germanides. Techniques for materials synthesis include vapor deposition (chemical vapor deposition and atomic layer deposition), liquid solution methods (sol-gel and precipitation) and solid-state pyrolysis. Copper metal films are formed on heated substrates by the reaction of copper(I) bicyclic amidinate vapor and hydrogen gas, whereas reaction with water vapor produces copper oxide. Silver and gold films were deposited on surfaces by reaction of their respective bicyclic amidinate vapors with hydrogen gas. Reaction of cobalt(II) bis(bicyclic amidinate) vapor, ammonia gas and hydrogen gas deposits cobalt metal films on heated substrates, while reaction with ammonia produces cobalt nitride and reaction with water vapor produces cobalt oxide. Ruthenium metal films are deposited by reaction of ruthenium(II) bis(bicyclic amidinate) or ruthenium(III) tris (bicyclic amidinate) at a heated surface either with or without a co-reactant such as hydrogen gas or ammonia or oxygen. Suitable applications include electrical interconnects in microelectronics and magnetoresistant layers in (Continued)

magnetic information storage devices. Hafnium oxide films are deposited by reaction of hafnium(IV) tetrakis(bicyclic amidinate) with oxygen sources such as water, hydrogen peroxide or ozone. The $HfO_2$ films have high dielectric constant and low leakage current, suitable for applications as an insulator in microelectronics. The films have very uniform thickness and complete step coverage in narrow holes.

13 Claims, 14 Drawing Sheets

(51) Int. Cl.
| | |
|---|---|
| C23C 16/18 | (2006.01) |
| C07F 15/04 | (2006.01) |
| C07F 15/00 | (2006.01) |
| C07F 15/06 | (2006.01) |
| C07F 15/02 | (2006.01) |
| C07F 11/00 | (2006.01) |
| C07F 13/00 | (2006.01) |
| C07F 9/00 | (2006.01) |
| C07F 3/06 | (2006.01) |
| C07F 3/02 | (2006.01) |
| C07F 3/00 | (2006.01) |
| C07F 7/28 | (2006.01) |
| C07F 5/00 | (2006.01) |
| H01L 21/02 | (2006.01) |
| C07F 1/08 | (2006.01) |
| C07F 7/00 | (2006.01) |
| G06N 20/00 | (2019.01) |
| G06F 16/951 | (2019.01) |
| C23C 16/455 | (2006.01) |

(52) U.S. Cl.
CPC .............. *C07F 3/06* (2013.01); *C07F 5/003* (2013.01); *C07F 7/003* (2013.01); *C07F 7/28* (2013.01); *C07F 9/005* (2013.01); *C07F 11/005* (2013.01); *C07F 13/005* (2013.01); *C07F 15/0046* (2013.01); *C07F 15/025* (2013.01); *C07F 15/045* (2013.01); *C07F 15/065* (2013.01); *C23C 16/18* (2013.01); *C23C 16/45553* (2013.01); *G06F 16/951* (2019.01); *G06N 20/00* (2019.01); *H01L 21/02205* (2013.01)

(56) References Cited

OTHER PUBLICATIONS

Barry, Amidinates, guanidinates and iminopyrrolidinates: Understandingprecursor thermolysis to design a better ligand, Coordination Chemistry Reviews, 2013, 257, 3192-3201.*
Benati et al., "Cyclizations of N-Stannylaminyl Radicals onto Nitriles," Organic Letters, Jan. 10, 2004, vol. 6, No. 3, pp. 417-420.
Coyle et al., "Preventing thermolysis: precursor design for volatile copper compounds," Chemical Communications, Sep. 6, 2012, vol. 48, pp. 10440-10442.
de Rouffignac et al., "Atomic Layer Deposition of Y2O3 Thin Films from Yttrium Tris(N,N'-diisopropylacetamidinate) and Water," Chemistry of Materials, Aug. 17, 2005, vol. 17, No. 19, pp. 4808-4814.
George, "Atomic Layer Deposition: An Overview," Chemical Reviews (2010), published online Nov. 30, 2009, vol. 110, No. 1, pp. 111-131.
Gordon, "Chapter 2: ALD Precursors and Reaction Mechanisms," Atomic Layer Deposition for Semiconductors, Springer Science + Business Media, New York, 2014 Edition (Oct. 19, 2013), pp. 15-46.
Heinzer et al., "Über 3,3,6,9,9-Pentamethyl-2,10-diaza-bicyclo-[4.4.0]-1-decen and some of its derivatives," abstract only, Helvetica Chimica Acta, Dec. 13, 1978, vol. 61, Issue 8, pp. 2851-2874.
Higashi et al., "A Convenient Method for the Preparation of Cyclic Amidines Using Bis(tnmethylsilyl)acetamide," Chem. Pharm. Bull. (1986) vol. 34, No. 12, pp. 4927-4932.
Janne et al., "Synthetic Routes to a New Bicyclic Amidine, 1,2,3,4,4a,5,6,7-Octahydro-1,8-naphthyridine (2,10-Diazabicyclo[4.4.0]dec-1-ene)," Synthesis Jul. 1976, vol. 7, pp. 452-453.
Johnson et al., "A brief review of atomic layer deposition: from fundamentals to applications," Materials Today, Jun. 2014, vol. 17, No. 5, pp. 236-246.
Li et al., "On the Relative Stability of Cobalt- and Nickel-Based Amidinate Complexes Against ß-Migration," International Journal of Quantum Chemistry (2009), first published Oct. 16, 2008, vol. 109, pp. 756-763.
Li et al., "Synthesis and Characterization of Copper(I) Amidinates as Precursors for Atomic Layer Deposition (ALD) of Copper Metal," Inorganic Chemistry, Feb. 3, 2005, vol. 44, No. 6, pp. 1728-1735.
Li et al., "Synthesis and characterization of volatile liquid cobalt amidinates," Dalton Transactions, Apr. 14, 2008, Issue 19, pp. 2592-2597.
Li et al., "Vapor Deposition of Ruthenium from an Amidinate Precursor," Journal of The Electrochemical Society, Oct. 11, 2007, vol. 154, No. 12, pp. D642-D647.
Lim et al., "Atomic layer deposition of transition metals," Nature Materials, Nov. 2003, vol. 2, pp. 749-754.
Lim et al., "Synthesis and Characterization of Volatile, Thermally Stable, Reactive Transition Metal Amidinates," Inorganic Chemistry, published online Oct. 25, 2003, vol. 42, No. 24, pp. 7951-7958.
Lofas et al., "Spiro- and Bicyclic Azalactams by Hydrolysis of α-Chlorinated Bicyclic Amidines," J. Heterocyclic Chem., Mar.-Apr. 1984, vol. 21, pp. 583-586.
Putkonen et al., "Organometallic Precursors for Atomic Layer Deposition," Topics in Organometallic Chemistry, published online Aug. 27, 2005, vol. 9, pp. 125-145.
Robison et al., "7-Azaindole. IV. The Hydrogenation of 7-Azaindole and Related Compounds," J. Am. Chem. Soc., May 20, 1957, vol. 79, pp. 2573-2578.
Wan et al., "The Scope and Mechanism of Phosphonium-Mediated SNAr Reactions in Heterocyclic Amides and Ureas," Journal of Organic Chemistry, Nov. 29, 2007, vol. 72, No. 26, pp. 10194-10210.
Wu et al., "Computational Study on the Relative Reactivities of Cobalt and Nickel Amidinates via ß-H Migration," Organometallics, Apr. 21, 2007, vol. 26, No. 11, pp. 2803-2805.

* cited by examiner

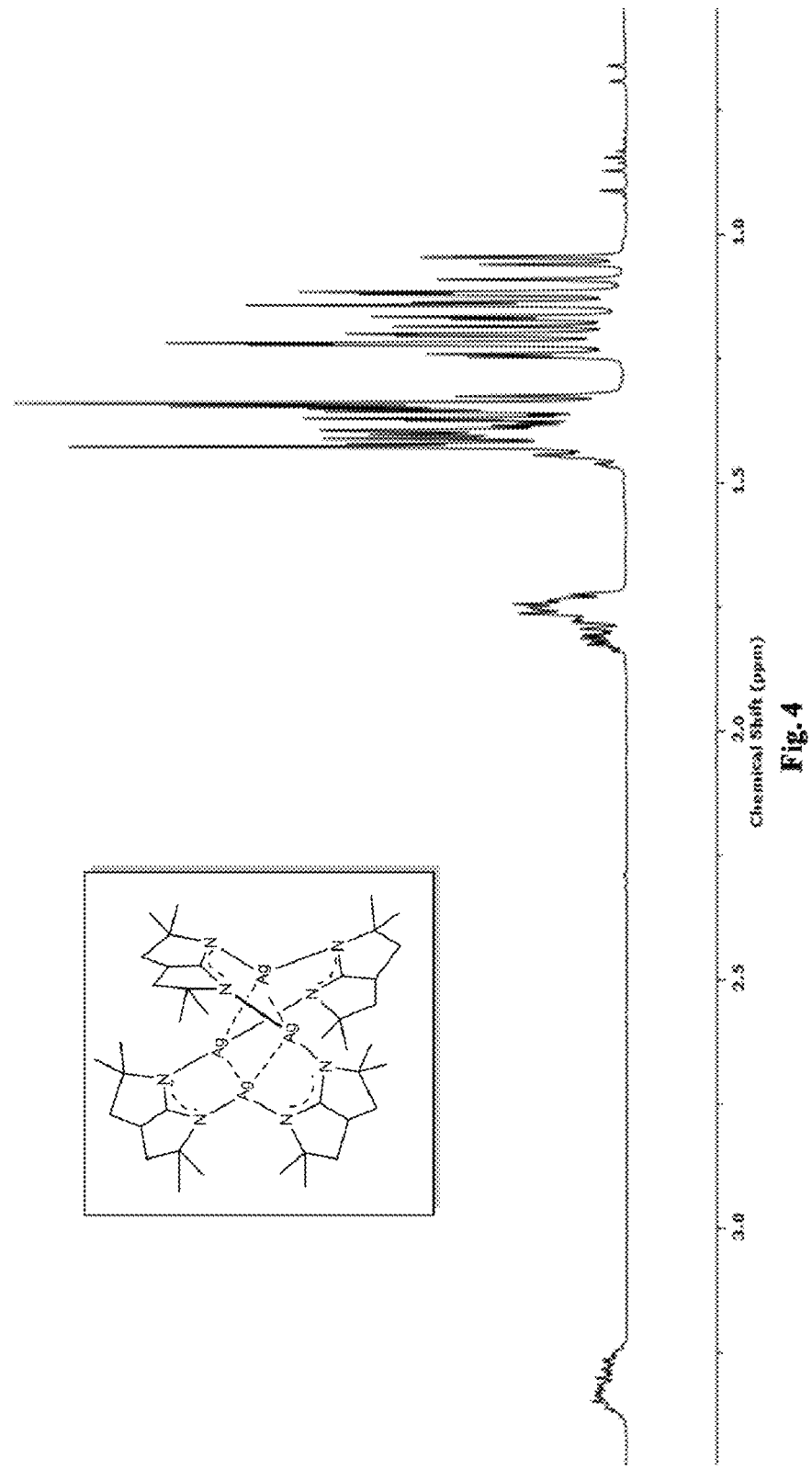

a

METAL BICYCLIC AMIDINATES

RELATED APPLICATIONS

This application claims priority to U.S. Provisional Patent Application No. 62/477,205, filed Mar. 27, 2017, the contents of which are incorporated herein in its entirety.

INCORPORATION BY REFERENCE

All patents, patent applications and publications cited herein are hereby incorporated by reference in their entirety in order to more fully describe the state of the art as known to those skilled therein as of the date of the invention described herein.

BACKGROUND

1. Field of the Invention

This invention relates to novel bicyclic amidine compounds. This invention also relates to metal-bicyclic amidinate compounds, methods for producing these compounds, and their use as precursors in vapor deposition processes. This invention may be applied to the fabrication of microelectronic devices.

2. Description of the Related Art

As the speed and functionality of semiconductor microelectronic devices are improved, new materials are needed. For example, electrically insulating materials with high dielectric constants ("high-k dielectrics") are now being used in the manufacture of computer logic and memory devices. Aluminum oxide, hafnium oxide and tantalum oxide are currently in commercial use, and oxides, nitrides and silicates of zirconium, lanthanum, lutetium, titanium and strontium are being tested as alternatives for future use. These high-k materials may be used as insulators in transistors in microelectronic devices, in DRAM (dynamic random access memory) and FLASH memory, and in decoupling capacitors. These materials may need to be deposited into narrow holes with aspect ratios over 60:1.

Materials with higher electrical conductivity are needed to form the wiring between transistors in integrated circuits. Copper has higher electrical conductivity and better stability against electro-migration than does aluminum. Therefore, copper is now more commonly used in silicon semiconductors. This trend is described in the International Technology Roadmap for Semiconductors, published on the Internet.

Copper interconnections must also be disposed conformally in structures, such as narrow holes and trenches, and the resulting films must have highly uniform thickness. If there are variations in thickness, the electrical conductivity of the copper in a trench or via is degraded because of increased electron scattering from the rough surface of the copper. Thus high-quality barrier/adhesion layers desirably have very smooth surfaces and uniform thickness even inside narrow holes and trenches. Electrically conductive nitrides of metals such as tantalum, tungsten, hafnium, zirconium, titanium, manganese, niobium and molybdenum can serve as barriers against the diffusion of copper. These refractory metals also find use as electrodes for capacitors and transistors or electrical interconnections in microelectronic devices.

Advanced designs for magnetic memory integrated with microelectronic circuits call for highly uniform and conformal layers of metals (particularly Fe, Co, Ni, Cu, Ru, Mn and Pt) with tightly controlled thickness and sharp interfaces. Thin layers of copper and cobalt are used, for example, to form magnetoresistant write and read heads for magnetic information storage. These layers need to have very uniform thicknesses and very few defects or pinholes. Designs now call for three-dimensional structures, so it is advantageous to have deposition processes for metals and metal compounds that produce layers with more uniform and conformal thickness on three-dimensional substrates.

Physical vapor deposition (PVD) techniques for depositing materials typically have poor step coverage, for example, giving only 20% thickness at the bottom of a hole with aspect ratio 5:1.

Vapor deposition is more suitable for making smooth, conformal layers that are uniform in thickness and composition even on substrates with features having high aspect ratios. One version of vapor deposition is called "atomic layer deposition", or ALD (also known as atomic layer epitaxy). An ALD process deposits thin layers of solid materials using two or more different vapor phase precursors. The surface of a substrate onto which film is to be deposited is exposed to a dose of vapor from one precursor. Then any excess unreacted vapor from that precursor is pumped away. Next, a vapor dose of the second precursor is brought to the surface and allowed to react. This cycle of steps can be repeated to build up thicker films. ALD reactions are self-limiting, so that only a certain maximum thickness can form in each cycle, after which no further deposition occurs during that cycle, even if excess reactant is available. Because of this self-limiting character, ALD reactions produce coatings with highly uniform thicknesses. Uniformity of ALD film thicknesses extends not only over flat substrate surfaces, but also into narrow holes and trenches. This ability of ALD to make conformal films is called "good step coverage."

Another version of vapor deposition is chemical vapor deposition (CVD). In a CVD process, a vapor or a vapor mixture reacts to deposit material on a surface. The reaction may be initiated by heating the surface, or by energy supplied electrically (plasma-activation), by light or other means. If the reactions on the surface are slow compared to the rate of transport up to the surface, then films with good conformality may also be obtained by CVD at higher deposition rates than those obtainable by ALD.

Some CVD and ALD techniques demonstrate selective deposition, in that deposition occurs on some substrate materials while depositing slowly or not at all on other materials. Thus it would be advantageous to have deposition processes having high step coverage and demonstrating selective deposition.

Many types of compounds have been used as precursors for vapor deposition. Successful precursors for vapor deposition must be volatile, thermally stable, and highly reactive. Identifying compounds that meet all of these challenging requirements is difficult. Fully satisfactory precursors for metals such as barium, strontium, hafnium, zirconium, tantalum, niobium, tungsten, molybdenum, tin, tellurium and uranium are not known. Halides, such as $ZrCl_4$, $HfCl_4$, and $TaCl_5$, have difficulty nucleating on some substrate surfaces, and the byproduct hydrochloric acid can prevent fully conformal deposition inside narrow holes. Alkoxides and dialkylamides have less than optimal thermal stabilities. Organometallic compounds may lack suitable reactivity, for example, by leaving carbon as an impurity in the films. Thus there is a need for more volatile, thermally stable, and highly reactive sources for these metals.

Patent Application WO 2004/046417 disclosed particular advantages of using vapors of metal amidinates as precursors for vapor deposition, such as volatility and reactivity suitable for use in vapor deposition. Nevertheless, new classes of compounds are sought that provide additional advantages for vapor deposition, such as greater thermal stability. More thermally stable precursors provide a wider temperature range for vaporization without decomposition, and a wider range of substrate temperatures for use in ALD.

SUMMARY

One aspect of the present invention provides bicyclic amidine compounds with two fused 5-membered rings having the general structure shown below, in which the two nitrogen atoms are not in bridgehead positions but on different rings:

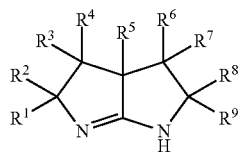

After deprotonation, these bicyclic amidine compounds become anionic amidinate ligands that may be described by two resonance forms:

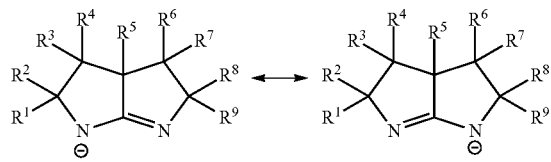

These two resonance forms of the anionic bicyclic amidinate ligand A can be represented by the abbreviated description below:

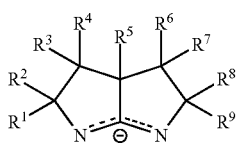

in which each of $R^1$ through $R^9$ are independently selected from the group consisting of hydrogen, hydrocarbon groups, substituted hydrocarbon groups, and other groups of non-metallic atoms. The hydrocarbon groups $R''$ are preferably non-aromatic.

One aspect of the disclosure includes metal coordination compounds based on bicyclic amidine compounds as ligands. In one or more embodiments, the bicyclic amidine compounds have the general formula $M_xA_yL_z$, where M is a metal, A is an anionic ligand based on a bicyclic amidine and L is another optional anionic or neutral ligand, and x and y are numbers greater than or equal to 1, and z is a number greater or equal to zero. Typically, the ratio y/x lies in the range from 1 to 4. In order to produce a volatile compound, x, y and z are normally chosen to produce neutral molecules $M_xA_yL_z$.

In other embodiments, a metal bicyclic amidinate may include 5-, 6-, 7- or 8-membered rings on the ligand. The rings may be of the same or different size.

In one or more embodiments, bicyclic amidinates include fused ring bicyclic amidinates in which each ring shares at least one side with an adjacent ring. The fused rings may be 5-, 6-, 7- or 8-membered rings. The fused rings may be the same ring size, or different. The fused ring may include two or more ring functionalities.

For simplicity in representing the compounds formed by these ligands with metals, any one of the bicyclic amidinates ligands may be represented by the schematic formula:

The metal bicyclic amidinate compounds of the present invention may also contain other neutral or anionic ligands that are not bicyclic amidinate ligands, provided at least one bicyclic amidinate ligand is attached to at least one metal. Non-limiting examples of such auxiliary neutral ligands are carbon monoxide, alkenes, alkynes and amines. Examples of anionic auxiliary ligands are non-bicyclic amidinate, cyclopentadienyl, dialkylamide, alkyl, alkoxide, halide, beta-diketonate, beta-ketoiminate and beta-diiminate ligands. In the case of anionic auxiliary ligands, the number of bicyclic amidinate ligands required for compound neutrality may be reduced.

In one or more embodiments, metal bicyclic amidinates include volatile metal(I) bicyclic amidinates. Some of these compounds have a dimeric structure:

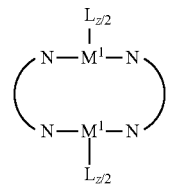

where L represents a neutral donor ligand present in amounts z=0, 1, 2 or more. Suitable monovalent metals $M^1$ include copper(I), silver(I), gold(I), iridium(I), thallium(I), lithium(I), sodium(I) and potassium(I).

One aspect of this embodiment includes novel bicyclic amidinate compounds containing a metal $M^1$ in oxidation state +1 and having the formula:

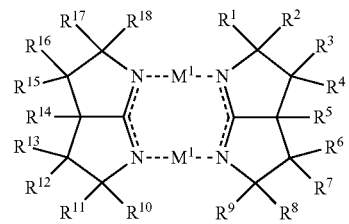

in which each of $R^1$ through $R^{18}$ are independently selected from the group consisting of hydrogen, hydrocarbon groups, substituted hydrocarbon groups, and other groups of non-metallic atoms.

Examples of this aspect include bicyclic amidinate compounds with formulas:

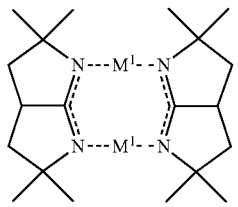

in which the metals $M^1$ are selected from Cu(I), Ag(I), Au(I), Ir(I), In(I) and K(I), and in which $R^1$, $R^2$, $R^8$, $R^9$, $R^{10}$, $R^{11}$, $R^{17}$ and $R^{18}$ are methyl and the remaining R-groups are hydrogen. One preferred copper bicyclic amidinate of this type is 2,2,5,5-tetramethyl-1,2,3,3a,4,5-hexahydropyrrolo[2,3-b]pyrrolylcopper(I) dimer,

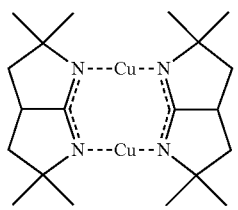

In one or more embodiments, the metal bicyclic amidinate has the chemical name 2,2,5,5-tetramethyl-1,2,3,3a,4,5-hexahydropyrrolo[2,3-b]pyrrolyl silver(I) tetramer, the X-ray crystal structure of which is shown in FIG. 5a.

In one or more embodiments, metal bicyclic amidinates include metal(II) bis-bicyclic amidinates. These compounds may have a monomeric structure.

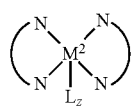

Dimers or higher oligomers of this structure may also be used. Neutral donor ligands L (z of them, with z=0, 1, 2 or more) may also be present. Suitable divalent metals M(II) include nickel, cobalt, chromium, iron, beryllium, magnesium, copper, zinc, titanium, vanadium, platinum, palladium, manganese, ruthenium, tin, cadmium, calcium, europium, strontium, lead, barium and tellurium. M(II) may also include semiconductors such as Ge(II).

Examples of this aspect include compounds with the following formula:

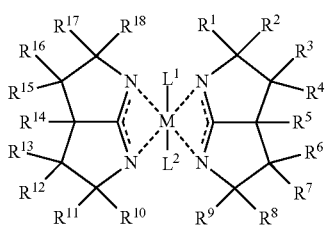

in which M is a metal or semiconductor M(II) in the +2 oxidation state and $L^1$ and $L^2$ are neutral ligands. Examples of neutral ligands are CO, alkenes, alkynes and phosphines. Other examples of this formula include a metal or semiconductor M(IV) in oxidation state +4 and $L^1$ and $L^2$ are mono-anionic ligands. Examples of mono-anionic ligands include methyl, methoxy and dimethylamido groups.

One preferred ruthenium bicyclic amidinate of this type is bis(2,2,5,5-tetramethyl-1,2,3,3a,4,5-hexahydropyrrolo[2,3-b]pyrrolyl)ruthenium(II) dicarbonyl, in which the L are two neutral carbonyl ligands are not directly chemically bonded to the bicyclic amidinate ligands:

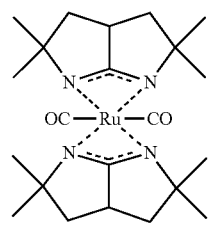

Another aspect of the disclosure includes bicyclic amidinate compounds containing a metal or semiconductor M(II) in oxidation state +2 and having formulas of the following type:

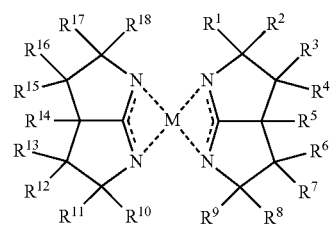

One preferred cobalt bicyclic amidinate is bis(2,2,5-tetramethyl-1,2,3,3a,4,5-hexahydropyrrolo[2,3-b]pyrrolyl)nickel(II):

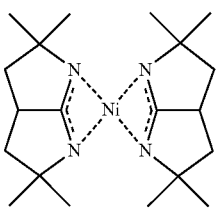

In one or more embodiments, bicyclic amidinates of trivalent metals include volatile metal(III) tris-bicyclic amidinates. Typically, these compounds have a monomeric structure.

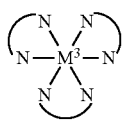

One aspect of the disclosure includes metal bicyclic amidinate compounds containing a metal or semiconductor M(III) in oxidation state +3 and having the following formula:

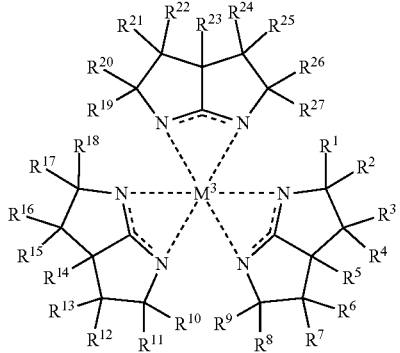

or oligomers thereof, in which each of $R^1$ through $R^{27}$ are independently selected from the group consisting of hydrogen, hydrocarbon groups, substituted hydrocarbon groups, and other groups of non-metallic atoms. Also included in the compound may be neutral ligands or other anionic ligands. Particularly suitable metals M(III) in oxidation state +3 include aluminum, cobalt, iron, chromium, gallium, vanadium, titanium, rhodium, ruthenium, osmium, iridium, molybdenum, tungsten, niobium, tantalum, scandium, antimony, indium, lutetium, ytterbium, thulium, erbium, thallium, yttrium, holmium, dysprosium, terbium, gadolinium, europium, samarium, neodymium, praseodymium, cerium, lanthanum, bismuth and uranium.

One preferred lanthanum bicyclic amidinate is tris(2,5-dimethyl-1,2,3,3a,4,5-hexahydropyrrolo[2,3-b]pyrrolyl)lanthanum(III)

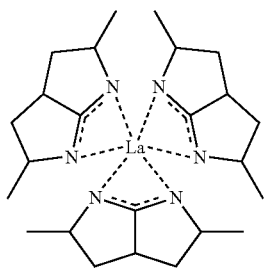

In one or more embodiments, precursors for tetravalent metals include metal(IV) tetra-bicyclic amidinates having a monomeric structure,

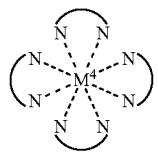

Suitable tetravalent metals include zirconium, hafnium, tin, tantalum, niobium, tungsten, molybdenum, uranium, rhenium, platinum, osmium, iridium, ruthenium, palladium, titanium, rhodium, vanadium, cerium, tellurium and lead.

Still another aspect of the disclosure includes bicyclic amidinate compounds containing a metal M(IV) in oxidation state +4 and having the formula of the following type:

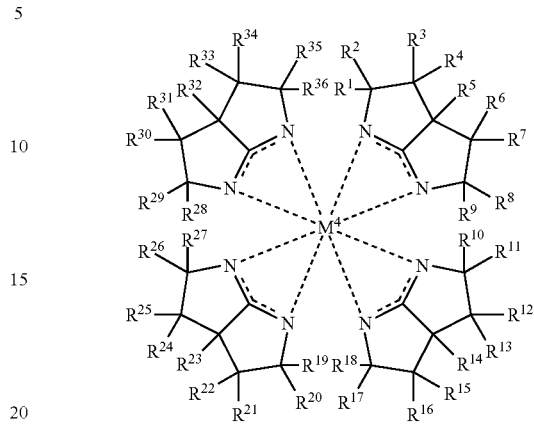

and its oligomers, in which each of $R^1$ through $R^{36}$ are independently selected from the group consisting of hydrogen, hydrocarbon groups, substituted hydrocarbon groups, and other groups of non-metallic atoms, and in which the metals or semiconductors M(IV) are selected from Si(IV), Ge(IV), Co(IV), Fe(IV), Mn(IV), Cr(IV), V(IV), Rh(IV), Ti(IV), Ru(IV), Ir(IV), Os(IV), Re(IV), Mo(IV), W(IV), Nb(IV), Ta(IV), Sn(IV), Hf(IV), Zr(IV), Tb(IV), Pb(IV), Te(IV), Pr(IV), Ce(IV), U(IV) and Th(IV).

One preferred embodiment of this type is tetrakis(1,2,3,3a,4,5-hexahydropyrrolo[2,3-b]pyrrolyl)hafnium(IV):

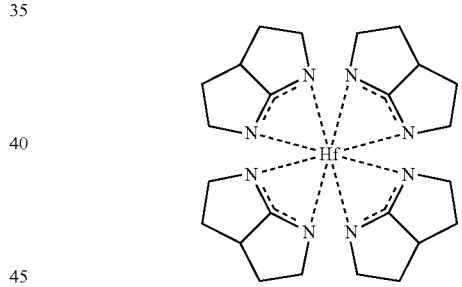

Still another aspect of the invention includes use of a bicyclic amidinate compound as a precursor in a process to deposit material from the vapor phase. This material may be in the form of films, coatings, wires, powders or other structures. Examples of the composition of the material include pure metals, metal oxides, metal nitrides, metal carbides, metal borides, metal silicides, metal sulfides, metal phosphides and combinations of these materials. Materials may also be formed by reaction or decomposition of these precursors in liquid solution, molten liquid or solid forms.

In some embodiments, metal bicyclic amidinate compounds provide greater thermal stability than metal non-bicyclic amidinates.

Another aspect of the present invention includes a process for depositing uniform, conformal and smooth films comprising metals such as copper, cobalt, nickel, palladium, iron, ruthenium, manganese, zinc, chromium, molybdenum, tungsten, vanadium, niobium, tantalum, titanium, zirconium, hafnium, scandium, yttrium, lithium, sodium, potassium, beryllium, magnesium, calcium, strontium, barium, aluminum, gallium, indium, tin, lead, antimony, tellurium, and lanthanum and the other lanthanides.

In another aspect of the invention, metal-containing coatings can be deposited at relatively low temperatures, and without plasma damage to substrates.

In at least one embodiment, metal-containing coatings with extremely uniform thicknesses are formed.

A related aspect of the present invention is the deposition of metal-containing coatings under conditions that produce good adhesion between substrates and the deposited coating, and, for example, adhere strongly to oxide substrates.

Other processes of the invention permit deposition of metal-containing coatings with extremely smooth surfaces.

Processes of the invention also provides vapor deposition of highly uniform metal-containing coatings over a range of conditions such as concentrations of reactants and position of the substrate inside the reactor.

In other aspects, conformal metal-containing coatings are formed over substrates with narrow holes, trenches or other structures. This ability is commonly known as "good step coverage." The coatings may be substantially free of pinholes or other mechanical defects.

In one aspect of the invention vapors of a volatile copper compound are reacted with hydrogen gas at a surface to produce thin layers of copper metal on the surface. Particularly suitable copper compounds are chosen from the class of copper(I) bicyclic amidinates.

In another aspect of the invention vapors of a volatile cobalt(II) bicyclic amidinate are reacted with hydrogen gas and/or ammonia at a surface to produce thin layers of cobalt metal or cobalt nitride on the surface. Reacting a volatile cobalt(II) bicyclic amidinate with water vapor can deposit cobalt oxide.

In another embodiment of the invention, bicyclic amidinates are reacted with hydrogen sulfide gas to deposit metal sulfides.

In another aspect of the invention vapors of a volatile lanthanum compound are reacted alternately with water vapor at a surface to produce thin layers of lanthanum oxide on the surface. Particularly suitable lanthanum compounds are chosen from the class of lanthanum(III) bicyclic amidinates. Replacing the water vapor in this process with ammonia gas can deposit lanthanum nitride.

In other embodiments, the deposited metal-containing coatings possess high electrical conductivity or other useful properties.

The coatings may be used as connectors in micro-electronic devices, e.g., copper layers, or as magnetic coatings, e.g., cobalt, as Co or Ru layers (and then Cu layer) on a diffusion barrier such as TiN, TaN or WN, in micro-electronic interconnect structures, or as Co/Cu nanolaminates having magneto-resistance properties. Coatings may also be placed on powders, wires or around and within complicated mechanical structures.

Other applications of these metal bicyclic amidinates are also envisioned, such as catalysts for chemical reactions.

BRIEF DESCRIPTION OF THE DRAWINGS

The foregoing and various other aspects, features, and advantages of the present invention, as well as the invention itself, may be more fully appreciated with reference to the following detailed description of the invention when considered in connection with the following drawings. The drawings are presented for the purpose of illustration only and are not intended to be limiting of the invention, in which:

FIG. 4. Proton NMR spectrum of a precursor used in the practice of at least one embodiment of the invention, silver (I) 2,2,5,5-tetramethyl-1,2,3,3a,4,5-hexahydropyrrolo[2,3-b]pyrrolide.

DETAILED DESCRIPTION

Figure 1:
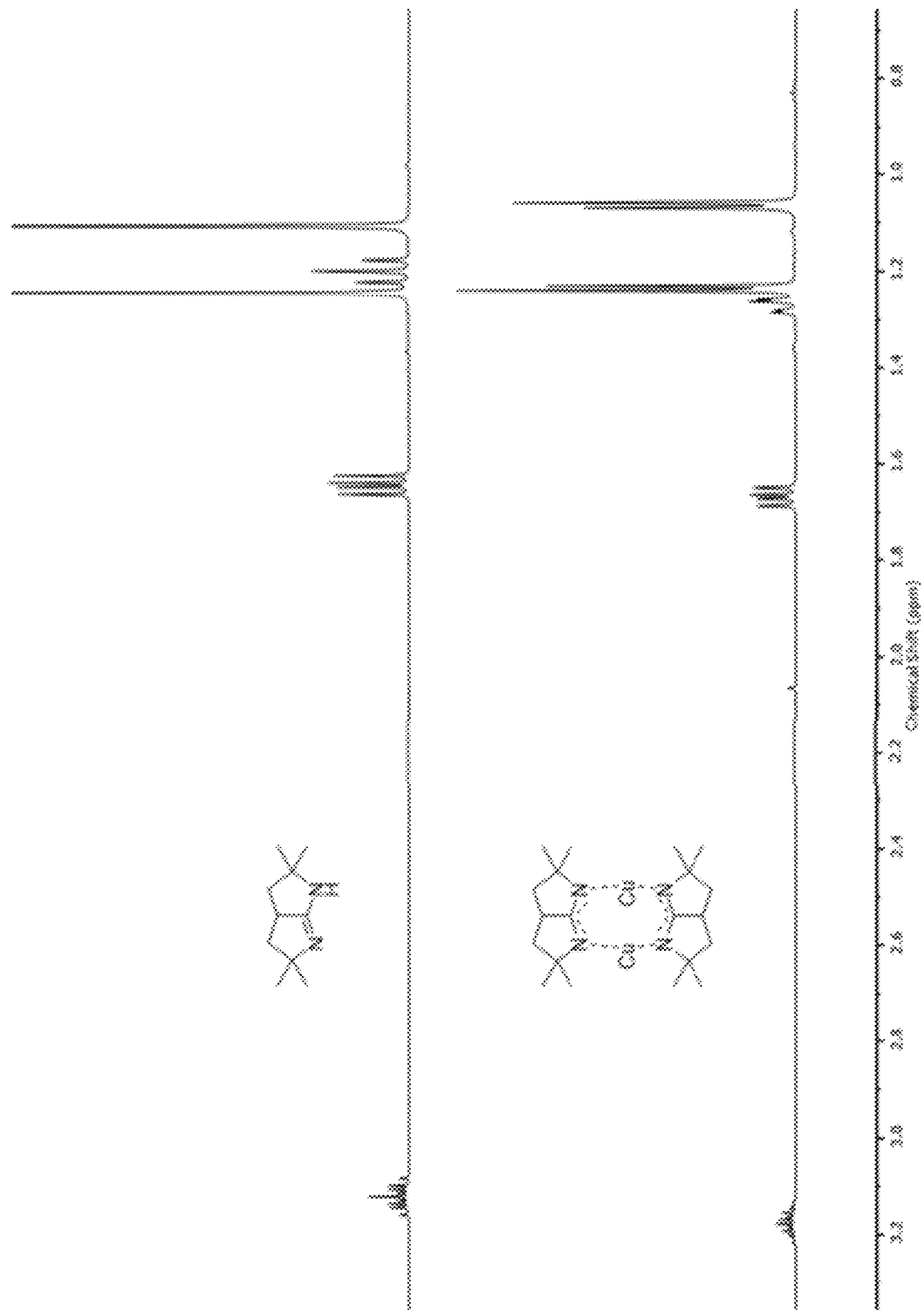
FIG. 1. (top) Proton NMR spectrum of a ligand used to form some of the compounds of this invention, 2,2,5,5-tetramethyl-1,2,3,3a,4,5-hexahydropyrrolo[2,3-b]pyrrole; and (bottom) proton NMR spectrum of a copper precursor used in the practice of at least one embodiment of the invention, copper(I) 2,2,5,5-tetramethyl-1,2,3,3a,4,5-hexahydropyrrolo[2,3-b]pyrrolide.

Metal bicyclic amidinates include one or more bicyclic amidinate ligands, "A." Bicyclic amidinate ligands are anionic ligands that may be attached to one or more metal ions to form a metal bicyclic amidinate. An "amidinate" as that term is used, means an anionic group containing two nitrogens and a bridging carbon connected by bonds with an order greater than one. A "bicyclic amidinate" as that term is used, means an amidinate with a two-ring structure incorporating the nitrogens of the amidinate group.

In one embodiment, bicyclic amidinates have two fused five-membered rings and are represented by the following structure A:

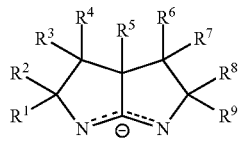

In this formula, $R^1$ through $R^9$, or "R" where n=1-9, represent groups made from one or more non-metal atoms. In some embodiments, IV may be chosen independently from hydrogen, alkyl, substituted alkyl, cycloalkyl, substituted cycloalkyl, aryl, substituted aryl, alkenyl, substituted alkenyl, alkynyl, substituted alkynyl, trialkylsilyl, dialkylamide or fluoroalkyl groups, or other non-metal atoms or groups containing non-metal atoms. Exemplary hydrocarbon groups include $C_1$-$C_6$ alkyl, $C_2$-$C_6$ alkenyl and $C_2$-$C_6$ alkynyl groups. They can be branched or unbranched. In preferred embodiments, $R^n$ are each independently hydrogen or alkyl groups containing 1 to 4 carbon atoms. The hydrocarbon groups are preferably non-aromatic. Conventional atom numbers for the ring carbons are shown for reference in formulas that follow:

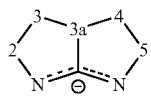

"Alkyl group" refers to a saturated hydrocarbon chain that may be a straight chain or branched chain or a cyclic hydrocarbon group, containing the indicated number of carbon atoms. For example, $C_1$-$C_6$ indicates that the group may have from 1 to 6 (inclusive) carbon atoms in it. Examples of alkyl groups include, but are not limited to, methyl, ethyl, propyl, isopropyl, butyl, and tert-butyl groups. Examples of cyclic alkyl groups include, but are not limited to, cyclopropyl, methylcyclopropyl, cyclobutyl, cyclopentyl, cyclohexyl, methylcyclohexyl, and cycloheptyl groups.

"$C_2$-$C_6$ alkenyl group" refers to a straight or branched chain unsaturated hydrocarbon containing 2-6 carbon atoms and at least one double bond. Examples of a $C_2$-$C_6$ alkenyl group include, but are not limited to, groups derived by removing a hydrogen from ethylene, propylene, 1-butylene, 2-butylene, isobutylene, sec-butylene, 1-pentene, 2-pentene, isopentene, 1-hexene, 2-hexene, 3-hexene, and isohexene.

"$C_2$-$C_6$ alkynyl group" refers to a straight or branched chain unsaturated hydrocarbon group containing 2-6 carbon atoms and at least one triple bond. Examples of a $C_2$-$C_6$ alkynyl group include, but are not limited to, groups derived by removing a hydrogen from acetylene, propyne, 1-butyne, 2-butyne, isobutyne, sec-butyne, 1-pentyne, 2-pentyne, isopentyne, 1-hexyne, 2-hexyne, and 3-hexyne.

"Substituted hydrocarbon group" refers to a saturated or unsaturated, straight or branched chain hydrocarbon containing 1-6 carbon atoms that can be further substituted with other functional groups, such as halogen or boron, or boron-containing groups.

"Halogen" refers to an atom of fluorine, chlorine, bromine, or iodine. Halogenated hydrocarbons include fluorinated, chlorinated or brominated alkyl. Exemplary fluorinated hydrocarbons include fluoroalkyl, fluoroalkenyl and fluoroalkynyl groups and combinations thereof.

"Groups of non-metallic atoms" include nitrogen-containing and silicon-containing groups. Exemplary nitrogen-containing R groups include amines (NR'R"), in which R' and R" include one or more of H, $C_1$-$C_6$ alkyl, $C_2$-$C_6$ alkenyl or $C_2$-$C_6$ alkynyl group and combinations thereof.

Exemplary silicon-containing R groups include silyl groups (SiR'R"R'"), in which R', R" and R'" include one or more of H, $C_1$-$C_6$ alkyl, $C_2$-$C_6$ alkenyl or $C_2$-$C_6$ alkynyl group and combinations thereof.

In one or more embodiments, one or more of the IV are selected from the group consisting of lower alkyls having 6 or less carbons and hydrogen. For compounds including more than one bicyclic amidinate, the R-groups on the amidinates may or may not be similarly substituted.

In one or more embodiments, one or more of the IV are alkyl groups that are unbranched at the α-position. For compounds including more than one bicyclic amidinate, the R-groups on the amidinates may or may not be similarly substituted.

"Neutral ligand" refers to molecules or moieties that are neutral in charge and that are capable of forming a coordinate bond with one or more metals. Many neutral ligands are known. Exemplary neutral ligands include alkenes, alkynes, phosphines and CO.

"Anionic ligand" refers to ionic species or moieties that are negatively charged and that are capable of forming a coordinate bond with one or more metals. Many anionic ligands are known. Exemplary anionic ligands include methyl, methoxy and dimethylamido groups.

"Oligomer" refers to compounds whose molecules may be considered to contain multiple copies of a monomeric unit.

While not being bound by any particular mode or theory of operation, it is believed that the lower alkyl substituents, and in particular the unbranched alkyl substituents contribute to the lower melting point and increased volatility of the metal complexes with the bicyclic amidinate ligands. Substituents that lower melting point and increase volatility, such as fluorohydrocarbons and silyl groups also promote the vapor deposition process. A lower melting point is advantageous for easy purification by distillation, convenient transfer of liquid air-sensitive compounds, and also for reproducible vaporization in a vapor deposition process. Volatility is necessary in a metal precursor compound for vapor deposition processes. The steric bulk of the substituted bicyclic guanidine ligands in a bicyclic amidinate compound may provide steric bulk that is useful in preventing or mitigating polymerization of the compound. Polymerization would reduce the desirable volatility of the compound. Thermal stability is enhanced by the rigid structures of the bicyclic ligands and the steric bulk of their substituents, which inhibit many of the potential pathways for thermal decomposition. Oligomer size may also be limited to provide compounds with volatility and stability suitable for vapor deposition processes.

In one or more embodiments, the metal in a metal bicyclic amidinate is one or more alkali metal, alkaline earth, transition metal or rare earth element in an oxidation state above zero (0). Exemplary metals include lithium, sodium, potassium, beryllium, magnesium, calcium, strontium, barium, scandium, yttrium, titanium, zirconium, hafnium, vanadium, niobium, tantalum, chromium, molybdenum, tungsten, manganese, iron, ruthenium, osmium, cobalt, rhodium, iridium, nickel, palladium, platinum, thallium, copper, silver, gold, zinc, cadmium, aluminum, gallium, indium, tin, lead, antimony, bismuth, tellurium, lutetium, ytterbium, thulium, erbium, thallium, holmium, dysprosium, terbium, gadolinium, europium, samarium, neodymium, praseodymium, cerium, lanthanum, and uranium.

In one or more embodiments, the ligand is symmetric. Exemplary symmetric bicyclic amidinate ligands include:

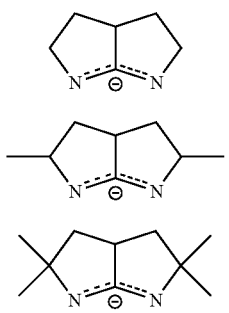

Ligand B, in which all the R'''s are hydrogen, is the least bulky ligand. It is suitable for metals in the +4 oxidation states, such as Zr(IV) and Hf(IV), or for smaller metals in the +3 oxidation state, such as Ga(III) or Cr(III). Ligand D, in which carbons at the 2 and 5 sites are each substituted with 2 methyl groups, is more bulky than B, and may be suitable for most metals in the +2 oxidation state. The ligand C, which includes a single methyl group attached to the 2 site and another single methyl group attached to the 5 site, has an intermediate size suitable for larger metals in the +3 oxidation state, such as La(III), Ce(III), Pr(III), Gd(III) and the other lanthanide metals. Thus the range of bulkiness among these three ligands (or other similarly substituted amidinates) allows selection of one that is suitable for most metals. Typically, the higher oxidation state of the metal, the higher its coordination number and the greater the number of ligands in the structure. However, $M_xA_yL_z$ is not limited to any particular combinations of ligand and metal.

In one or more embodiments, the ligand is asymmetric. An exemplary asymmetrically substituted bicyclic amidine E can produce more reactive metal bicyclic amidinates because the less substituted side (on the right in the following diagram) allows for easier access to reactant molecules.

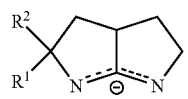

In one or more embodiments, unsymmetrical bicyclic amidinates form metal complexes with smaller divalent metal ions such as Co(II), Ni(II), Fe(II), Cr(II), Zn(II), Mn(II) or Mg(II) or with intermediate-sized trivalent metal ions such as Sb(III), Mo(III), W(III), Nb(III), Ta(III), Sc(III), In(III) or Lu(III). Asymmetric ligands tend to produce metal compounds with lower melting points. The melting points of the metal bicyclic amidinates may also be reduced by using IV groups composed of longer alkyl chains. The IV groups may be identical or dissimilar. In this way metal bicyclic amidinates that are liquid at room temperature can be made. These liquid precursors are easier to purify, transport and vaporize than are solid precursors with higher melting points.

Other examples of this aspect include bicyclic amidinate compounds with ligand D, having formulas of type:

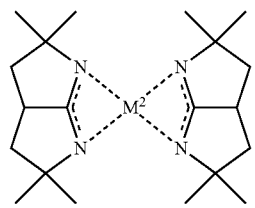

and its oligomers, in which the metals M(II) are selected from Zn(II), Sn(II), Mg(II), Cu(II), Fe(II), V(II), Pt(II), Mn(II), Pd(II), Ti(II), Ru(II), Ag(II), Cd(II), Ca(II), Tm(II), Hg(II), Yb(II), Dy(II), Eu(II), Sr(II), Sm(II), Pb(II), Te(II) and Ba(II).

Ligands of type B may be suitable for the smaller trivalent metals. Examples of this aspect include compounds with formulas of the following type:

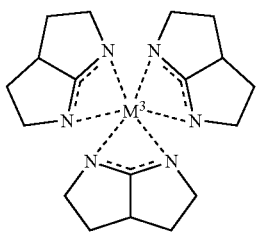

and its oligomers, in which the metals $M^3$ are selected from Al(III), Ni(III), Ga(III), Cr(III), Co(III), V(III), Fe(III), Mn(III), Ti(III), Rh(III), Ru(III), Ir(III), Mo(III), W(III), Nb(III), Ta(III), Sc(III), Sb(III), In(III) and Lu(III).

Ligands of type E may be suitable for somewhat larger trivalent metals indium, lutetium, ytterbium, thulium, erbium, thallium, yttrium, holmium, dysprosium and terbium.

Ligands of type C may be more suitable for still larger trivalent metals,

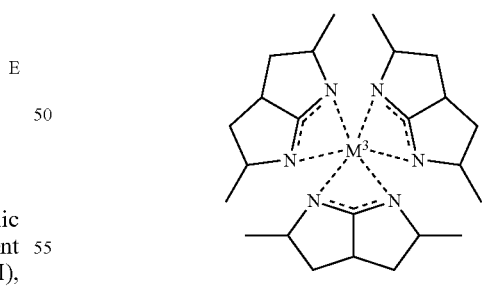

in which the metals $M^3$ are selected from Y(III), Ho(III), Dy(III), Tb(III), Gd(III), Eu(III), Sm(III), Nd(III), Pr(III), Ce(III) and La(III).

For very large metal ions, dimers or higher oligomers may form unless the bulkiest ligands are used. For example, the bulky ligands of type D may be suitable for the largest trivalent metals bismuth, uranium or lanthanum.

For metals $M^4$ in the +4 oxidation state, homoleptic bicyclic amidinates may be formed with the smaller ligands, such as B:

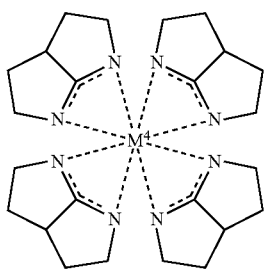

in which the metals M⁴ are selected from Mo(IV), W(IV), Nb(IV), Ta(IV), Sn(IV), Hf(IV), Zr(IV), Tb(IV), Pb(IV) and Te(IV). One preferred hafnium bicyclic amidinate of this type is tetrakis(1,2,3,3a,4,5-hexahydropyrrolo[2,3-b]pyrrolyl) hafnium(IV):

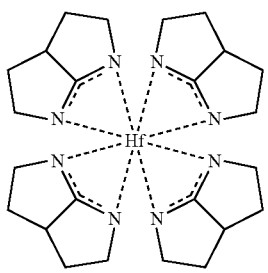

In other embodiments, some of the bicyclic amidinate ligands may be replaced by other anionic ligands, such as non-bicyclic amidinates, alkylamides, halides, alkoxides, alkyls, cyclopentadienyls, beta-diketonates, beta-ketoiminates and beta-diiminates.

Metal bicyclic amidinates may be prepared using any suitable method. Usually, the ligand is prepared first by methods of organic chemistry. Then the ligands are attached to the metal center. Following are some typical methods for attaching the ligands to the metal.

An alkali ($M^1$=Li, Na, K, Rb or Cs) amidinate can also be reacted with a metal halide $MX_n$ to form a metal amidinate:

An amidine may be converted into a metal amidinate by reacting the amidine with a metal hydride (R=H), a metal alkyl (R=alkyl), a metal alkylamide (R=dialkylamide) or a metal bis(trialkylsilyl)amide such as $R=N(SiMe_3)_2$:

Alternatively, this last reaction may be used to form an alkali metal salt of the amidine, which is then subsequently reacted with a metal halide to form the desired metal amidinate.

Few methods exist today for the synthesis of bicyclic amidines with nitrogen atoms on non-bridgehead positions on different rings. Following are examples of methods that can be used in the practice of the invention.

Scheme 1

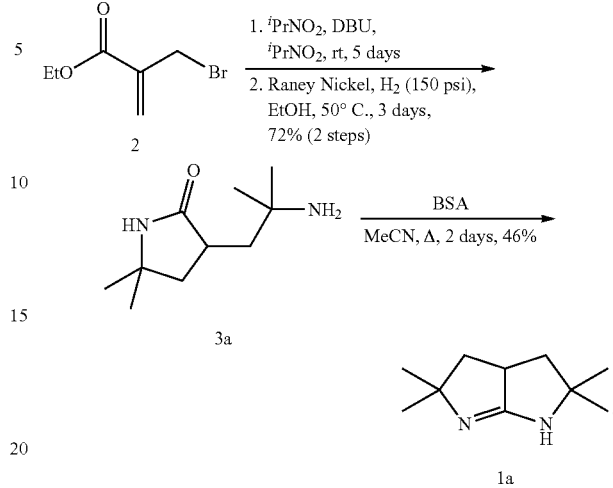

The synthesis of 2,2,5,5-tetramethyl-1,2,3,3a,4,5-hexahydropyrrolo[2,3-b]pyrrole (1a) began with the addition of 2 equivalents of 2-nitropropane to 2, which is commercially available. The crude product from this reaction contained a large amount of entrained 2-nitropropane; however, by exploiting the high volatility of isopropylamine, catalytic hydrogenation of the crude product with Raney Nickel in EtOH afforded pure 3a in 72% yield over 2 steps. Refluxing with N,O-bis(trimethylsilyl)acetamide (BSA) in acetonitrile then gave pure, anhydrous 1a in 46% yield after sublimation.

Inconveniently, a similar synthesis of 5,5-dimethyl-1,2,3, 3a,4,5-hexahydropyrrolo[2,3-b]pyrrole (1b) and 1,2,3,3a,4, 5-hexahydropyrrolo[2,3-b]pyrrole (1c) from 2 resulted in a large number of high molecular weight byproducts after the first step that were difficult to separate without the help of column chromatography. Instead, the synthetic route in Scheme 2 was developed.

Scheme 2

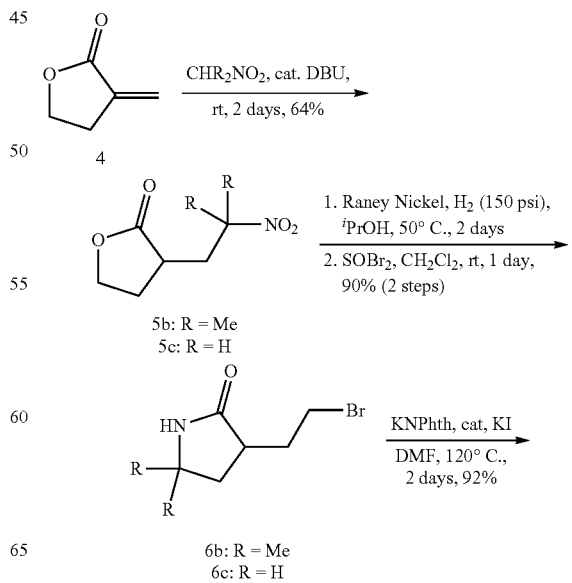

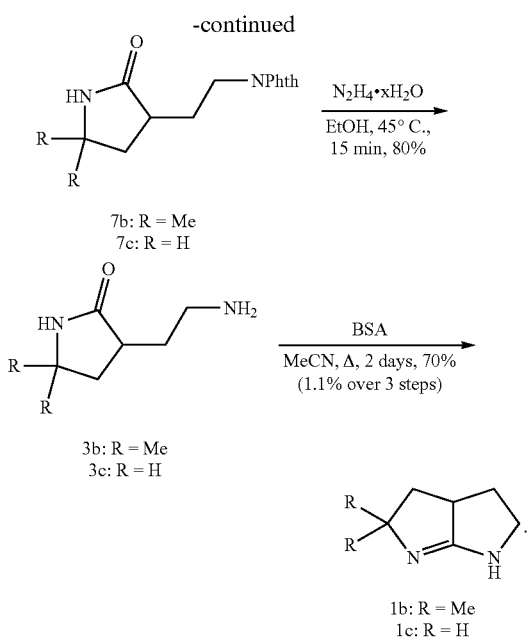

Starting from commercially available 4, conjugate addition of 2-nitropropane with a catalytic amount of DBU afforded 5b in 64% yield after recrystallization from isopropanol. Hydrogenation of the nitroester with Raney Nickel and subsequent bromination of the product gave 6b in 90% yield over the two steps after recrystallization from cyclohexane. Thereafter, reaction with potassium phthalimide and subsequent deprotection with hydrazine hydrate provided 7b and 3b in 72% and 80% yield respectively. Refluxing with BSA in acetonitrile then gave pure, anhydrous 1b in 70% yield after sublimation.

1c was synthesized through the same route, except that 4 was reacted with nitromethane instead of 2-nitropropane at the very beginning to give crude 5c, which was not isolated. Hydrogenation and subsequent bromination of the crude product gave pure 6c in 27% yield over the three steps after sublimation and two recrystallizations from cyclohexane, then toluene. Thereafter, reaction with potassium phthalimide in DMF provided crude 7c, which was not isolated. Deprotection with hydrazine hydrate, then treatment with BSA in refluxing acetonitrile gave pure, anhydrous 1c in 1.1% yield over three steps after sublimation.

It must be noted that the low yields stem from the high water solubility of 1c, 3c and 7c and the reagents used, leading to poor recovery of the products from the reaction mixture by extraction into organic solvents after workup, even when the aqueous phase is saturated with NaCl. Purification is also difficult for the same reason, except at the very end where 1c can be isolated by sublimation. Nevertheless, we anticipate that the yields will be ameliorated by optimizing workup procedures.

Liquid precursors generally have several advantages in practicing the invention. If the melting point of the metal amidinate is below room temperature, then the liquid compound can be made in high purity by fractional distillation. In contrast, solid materials are more difficult to purify by sublimation, which is less effective than distillation in removing impurities. Air-sensitive liquid compounds are also generally easier to handle and transfer than are solids.

Metal bicyclic amidinates with lower melting points can be made by using longer chain alkyl groups for R″. Unsymmetrical metal bicyclic amidinates generally have lower melting points than symmetric metal bicyclic amidinates. Alkyl groups with more than one stereo-isomer, such as sec-butyl, also lead to lower melting points. Use of one or more of these strategies can lead to desirable liquid precursors, rather than less desirable solid compounds.

Low melting points are also desirable in supplying vapor for a deposition process according to this invention. If the melting point of a compound is lower than the temperature at which the compound is vaporized, then the liquid source of vapor generally has faster kinetics of vaporization than solid compounds have. Also, sublimation of a solid often leaves its surface covered with a residue of less volatile material that impedes further vaporization. In a liquid source, on the other hand, any non-volatile residue may precipitate into the bulk of the liquid, leaving the liquid surface clean and capable of desirable rapid evaporation.

In a vapor deposition process, the metal bicyclic amidinate vapor and, optionally, a vapor of a second reactant are supplied to a surface. When the vapors are supplied at the same time to a surface, or if the optional second reactant is omitted, the process is called chemical vapor deposition (CVD). When the vapors are supplied alternately to a surface, then the process is called atomic layer deposition (ALD). Typical second reactants include hydrogen gas, ammonia gas, water vapor, ozone or hydrogen sulfide. When hydrogen gas is chosen as the second reactant, a metal may be deposited. When ammonia gas or other reactive source of nitrogen is chosen as the second reactant, a metal nitride is deposited. When water vapor, hydrogen peroxide, ozone or other reactive source of oxygen is chosen as the second reactant, a metal oxide is deposited. When hydrogen sulfide or other reactive source of sulfur is chosen as the second reactant, a metal sulfide is deposited.

According to one or more embodiments of the present invention, a metal amidinate is introduced onto a substrate as a vapor. Vapors of precursors may be formed by conventional methods from either liquid or solid precursors. In one or more embodiments, a liquid precursor may be vaporized by nebulization into a carrier gas preheated above the vaporization temperature, e.g., to about 100 to 200° C. The nebulization may be carried out pneumatically, ultrasonically, or by other suitable methods. Solid precursors to be nebulized may be dissolved in organic solvents, including hydrocarbons such as decane, dodecane, tetradecane, toluene, xylene, mesitylene and tetrahydronaphthalene, and ethers such as diglyme and tetraglyme, and amines such as pentamethyldiethylenetriamine, as well as esters, ketones, and chlorinated hydrocarbons. Solutions of liquid precursors may have lower viscosities than pure liquid precursors, so that in some cases it may be preferable to nebulize and evaporate solutions rather than pure liquids. The precursor liquid or precursor solutions may also be evaporated with thin-film evaporators, by direct injection of the liquids or solutions into a heated zone, or by heating in a bubbler. Commercial equipment for vaporization of liquids is made by ATMI, Inc. (Danbury, Conn.), Lam Research (San Jose, Calif.) and COVA Technologies (Colorado Springs, Colo.), Brooks Instrument (Hatfield, Pa.), MKS Instruments Inc. (Wilmington, Mass.), Horiba/STEC (Portland, Oreg.) and Kemstream (Montpellier, France). Ultrasonic nebulizers are made by Sonotek Corporation (Milton, N.Y.) and Cetac Technologies (Omaha, Nebr.).

The metal precursors of the present invention may be reacted with a reducing agent, e.g., hydrogen gas, to form films of the metal. For example, a copper(I) bicyclic amidinate may be reacted with hydrogen gas to form copper metal. In other embodiments, the metal precursors of the present invention may also be reacted with other suitably reactive reducing compounds to form metals. In some embodiments, the metal precursors of the present invention may be reacted with ammonia gas to form metal nitrides. For example, a cobalt(II) bicyclic amidinate may be reacted with ammonia gas to form cobalt nitride. In other embodiments, the metal precursors of the present invention may be reacted with water vapor to form metal oxides. For example, a lanthanum(III) bicyclic amidinate may be reacted with water vapor to form lanthanum oxide.

The process of the invention may be carried out using atomic layer deposition (ALD). ALD introduces a metered amount of a first reactant into a deposition chamber having a substrate therein for layer deposition. A thin layer of the first reactant is deposited on the substrate. Then any unreacted first reactant and volatile reaction by-products are removed by a vacuum pump and, optionally, a flow of inert carrier gas. A metered amount of a second reactant component is then introduced into the deposition chamber. The second reactant deposits on and reacts with the already deposited layer from the first reactant. Alternating doses of first and second reactants are introduced into the deposition chamber and deposited on the substrate to form a layer of controlled composition and thickness. The time between doses may be on the order of seconds and is selected to provide adequate time for the just-introduced component to react with the surface of the film and for any excess vapor and byproducts to be removed from the headspace above the substrate. It has been determined that the surface reactions are self-limiting so that a reproducible layer of predictable composition is deposited. As will be appreciated by one of ordinary skill in the art, deposition processes utilizing more than two reactant components are within the scope of the invention.

In other embodiments, the process of the invention may be carried out by CVD using apparatus well-known in the art.

The invention may be understood with reference to the following examples which are for the purpose of illustration only and which are not limiting of the invention, the full scope of which is set forth in the claims that follow.

All reactions and manipulations described in these methods should be conducted under a pure nitrogen atmosphere using either an inert atmosphere box or standard Schlenk techniques. The compounds produced by these procedures generally react with moisture and/or oxygen in the ambient air, and should be stored and handled under an inert, dry atmosphere such as pure nitrogen or argon gas. All reactions sensitive to moisture or oxygen were carried out in oven dried or flame dried and nitrogen-charged glassware. All anhydrous solvents were saturated with nitrogen and dried with 4 Å molecular sieves purchased from Sigma-Aldrich. All other solvents and reagents were used as received from commercial suppliers without prior purification unless otherwise specified.

$^1$H NMR and $^{13}$C NMR spectra were recorded on Varian INOVA 500 spectrometers at 500 MHz. NMR spectra were recorded in solutions of deuterated chloroform (CDCl$_3$) with the residual chloroform (7.24 ppm for $^1$H NMR and 77.23 ppm for $^{13}$C NMR) taken as the internal standard, or deuterated benzene (C$_6$D$_6$) with residual benzene (7.16 ppm for $^1$H NMR and 128.39 ppm for $^{13}$C NMR) taken as the internal standard, and chemical shifts are reported in parts per million (ppm). Abbreviations for signal coupling are as follows: s, singlet; bs, broad singlet; d, doublet; t, triplet; q, quartet; dd, doublet of doublet; ddd, doublet of doublet of doublet; dt, doublet of triplet; m, multiplet. Mass spectra were recorded at the Harvard University mass spectrometry facility.

Example 1. Synthesis of Tetramethyl 5,5-Bicyclic Amidine, 2,2,5,5-tetramethyl-1,2,3,3a,4,5-hexahydropyrrolo[2,3-b]pyrrole, compound 1a

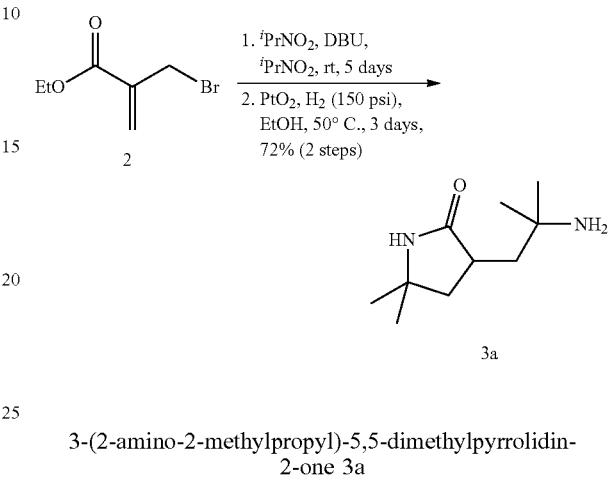

3-(2-amino-2-methylpropyl)-5,5-dimethylpyrrolidin-2-one 3a

DBU (29.53 g, 193.95 mmol) was dissolved in 500 ml of 2-nitropropane, followed by ethyl 2-(bromomethyl)acrylate 2 (18.72 g, 96.97 mmol). This was stirred at room temperature for 5 days, then concentrated under reduced pressure at 70° C. to give a large quantity of brown oil. This oil was taken up in 300 mL of Et$_2$O and washed with 3.0M HCl (3×200 mL), brine (2×100 mL), then dried over MgSO$_4$. Filtration and subsequent evaporation gave a blue-green oil that slowly solidified. This was dissolved in 1.5 L of EtOH, to which 20 g of MgSO$_4$ was added, followed by 20 g of Raney Nickel that had been washed three times with 20 mL of $^i$PrOH. The suspension was placed in a glass-lined Parr hydrogenator and pressurized with H$_2$ to 150 psi, then mechanically stirred for 3 days at 50° C. After release of H$_2$, the suspension was filtered through a Celite pad and volatiles removed in vacuo to give a large amount of crude 3a as a pale brown solid. This was dissolved in 200 mL of 3.0M HCl and washed with CH$_2$Cl$_2$ (3×100 ml), then basified with 150 mL of 10.0M NaOH, causing 3a to precipitate out of solution. The suspension was then extracted with CH$_2$Cl$_2$ (5×100 mL), and the extracts combined, dried using anhydrous MgSO$_4$, filtered and evaporated to provide pure 3a (12.89 g, 72% over 2 steps) as a white solid, mp. 125-127° C. $^1$H NMR (500 MHz, CDCl$_3$) δ 5.92-5.70 (bs, 1H), 2.71-2.64 (m, 1H), 2.30-2.23 (m, 1H), 2.16-2.09 (m, 1H), 2.00-1.75 (bs, 2H), 1.67-1.60 (m, 1H), 1.36-1.29 (m, 1H), 1.28 (s, 3H), 1.24 (s, 3H), 1.15 (s, 3H), 1.12 (s, 3H); $^{13}$C NMR (125 MHz, CDCl$_3$) δ 178.9, 54.6, 49.9, 46.4, 45.4, 38.4, 31.6, 30.6, 30.3, 29.0; HRMS (ESI): m/z calcd. for C$_{10}$H$_{21}$N$_2$O (M+H$^+$) 185.1648, found 185.1651.

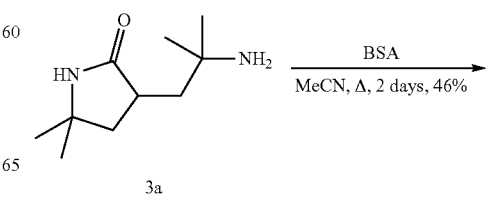

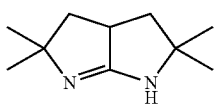

1a 2,2,5,5-tetramethyl-1,2,3,3a,4,5-hexahydropyrrolo[2,3-b]pyrrole 1a 3a (12.89 g, 69.95 mmol) was suspended in 200 mL of MeCN. Upon addition of N,O-bis(trimethylsilyl)acetamide, (BSA, 28.48 g, 140.00 mmol), all solids quickly dissolved. The solution was refluxed for 2 days, during which the progress of the reaction was monitored by HRMS. (Note: if the reaction does not go to completion, more BSA can be added to the reaction mixture as required.) Once the reaction was complete, the reaction mixture was concentrated under reduced pressure. The remaining oil was dissolved in 200 mL of 3.0M HCl and washed with $CH_2Cl_2$ (3×100 ml), then ice was added and the solution basified with 125 mL of 10.0M NaOH, causing 1a to precipitate out of solution. The suspension was then extracted with $CH_2Cl_2$ (4×100 mL), and the extracts combined, dried using anhydrous $MgSO_4$, filtered and evaporated to provide crude 1a (8.65 g, 74%) as a pale brown solid. Sublimation overnight at 70° C. gave pure, anhydrous 1a (5.30 g, 46%) as a white solid suitable for the synthesis of metal-containing ALD precursors, mp. 182-183° C. $^1$H NMR (500 MHz, $C_6D_6$) δ 9.20-8.45 (bs, 1H), 3.22-3.14 (m, 1H), 1.73-1.66 (m, 2H), 1.33 (s, 6H), 1.29-1.23 (m, 2H), 1.17 (s, 6H); this proton NMR spectrum is plotted in FIG. 1; $^{13}$C NMR (125 MHz, $C_6D_6$) δ 174.9, 69.8, 46.2, 45.3, 31.5, 29.1; HRMS (ESI): m/z calcd. for $C_{10}H_{19}N_2$ (M+H$^+$) 167.1543, found 167.1547.

Example 2. Synthesis of Dimethyl 5,5-Bicyclic Amidine, 5,5-dimethyl-1,2,3,3a,4,5-hexahydropyrrolo[2,3-b]pyrrole, compound 1b

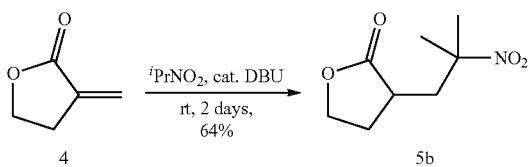

3-(2-methyl-2-nitropropyl)dihydrofuran-2(3H)-one 5b. 5 mL of DBU was dissolved in 500 mL of 2-nitropropane, followed by 3-methylenedihydrofuran-2(3H)-one 4 (25.65 g, 261.47 mmol). This was stirred at room temperature for 2 days, then concentrated under reduced pressure at 70° C. to give a large quantity of brown oil. This oil was taken up in 250 mL of $CH_2Cl_2$ and washed with 3.0M HCl (2×250 mL), water (1×250 mL), saturated aqueous $NaHCO_3$ (1×250 mL), brine (1×250 mL), then dried using anhydrous $MgSO_4$. Filtration and subsequent evaporation gave 44.06 g (90%) of crude 5b as a pale brown solid, which was recrystallized from $^i$PrOH to yield pure 5b (31.12 g, 64%) as white crystals, mp. 64-66° C. $^1$H NMR (500 MHz, CDCl$_3$) δ 4.36-4.30 (m, 1H), 4.15-4.08 (m, 1H), 2.57-2.45 (m, 2H), 2.38-2.30 (m, 1H), 2.19-2.12 (m, 1H), 1.94-1.83 (m, 1H), 1.643 (s, 3H), 1.636 (s, 3H); $^{13}$C NMR (125 MHz, CDCl$_3$) δ 178.4, 87.1, 66.7, 41.7, 36.2, 29.5, 28.1, 24.5; HRMS (ESI): m/z calcd. for $C_8H_{13}NNaO_4$ (M+Na$^+$) 210.0737, found 210.0738.

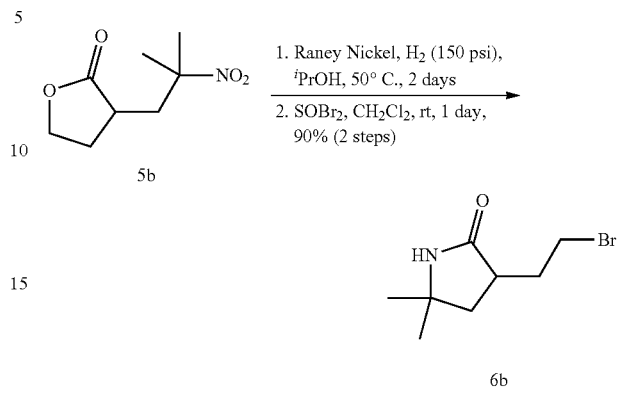

3-(2-bromoethyl)-5,5-dimethylpyrrolidin-2-one 6b 5b (15.56 g, 83.12 mmol) was stirred in 1 L of $^i$PrOH, together with 20 g of $MgSO_4$ and 10 g of Raney Nickel that had been rinsed three times with 10 mL of $^i$PrOH. The suspension was placed in a glass-lined Parr hydrogenator and pressurized with $H_2$ to 150 psi, then mechanically stirred for 2 days at 50° C. After release of $H_2$, the suspension was filtered through a Celite pad and volatiles removed in vacuo to give 12.79 g of a white solid that was used without any further purification. The solid (12.79 g, 81.34 mmol) was dissolved in 400 mL of $CH_2Cl_2$. $SOBr_2$ (21.14 g, 101.69 mmol) was carefully added as a neat liquid and the solution stirred for 1 day, after which 400 mL of saturated $NaHCO_3$ was slowly added to work up the reaction. The organic phase was isolated and the aqueous phase extracted with $CH_2Cl_2$ (3×200 mL). Extracts were combined and dried using anhydrous $MgSO_4$, filtered and evaporated to give crude 6b (17.58 g, 98%) as a slightly off-white solid. Recrystallization from cyclohexane afforded pure 6b (16.39 g, 92%) as white needles, mp. 110-111° C. $^1$H NMR (500 MHz, CDCl$_3$) δ 6.72-6.48 (bs, 1H), 3.60-3.52 (m, 1H), 3.48-3.38 (m, 1H), 2.77-2.67 (m, 1H), 2.45-2.34 (m, 1H), 2.20-2.11 (m, 1H), 1.88-1.76 (m, 1H), 1.57-1.47 (m, 1H), 1.27 (s, 3H), 1.23 (s, 3H); $^{13}$C NMR (125 MHz, CDCl$_3$) δ 177.7, 54.8, 42.2, 40.3, 34.7, 31.8, 30.2, 28.9; HRMS (ESI): m/z calcd. for $C_8H_{15}NOBr$ (M+H$^+$) 220.0332, found 220.0342.

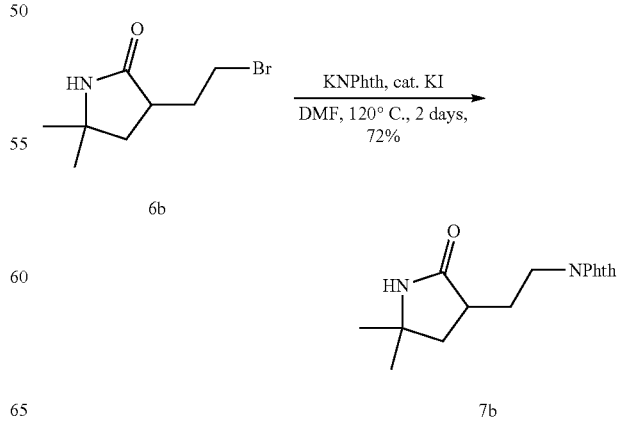

2-(2-(5,5-dimethyl-2-oxopyrrolidin-3-yl)ethyl)isoindoline-1,3-dione 7b 6b (11.36 g, 51.61 mmol) was dissolved in 400 mL of DMF, to which potassium phthalimide (11.47 g, 61.93 mmol) and potassium iodide (1.72 g, 10.36 mmol) were added. The suspension was stirred at 120° C. for 2 days, after which most of the solvent was removed in vacuo. This was taken up into 800 mL of $CH_2Cl_2$ and washed with water (3×800 mL) and 5% aqueous LiCl (2×800 mL), then dried over $MgSO_4$. Filtration and evaporation gave crude 7b (14.15 g, 96%) as an off-white solid that was recrystallized from toluene/cyclohexane to afford pure 7b (10.64 g, 72%) as white plates, mp. 154-156° C. $^1$H NMR (500 MHz, $CDCl_3$) δ 7.74-7.69 (dd, 2H, J=5.5, 3.5 Hz), 7.63-7.58 (dd, 2H, J=6.0, 3.5 Hz), 7.14-7.05 (bs, 1H), 3.71-3.61 (m, 2H), 2.51-2.42 (m, 1H), 2.24-2.13 (m, 2H), 1.59-1.49 (m, 2H), 1.19 (s, 3H), 1.13 (s, 3H); $^{13}$C NMR (125 MHz, $CDCl_3$) δ 177.7, 168.2, 133.9, 132.0, 123.2, 54.6, 42.1, 39.6, 36.2, 30.7, 30.0, 28.8; FIRMS (ESI): m/z calcd. for $C_{16}H_{19}N_2O_3$ (M+H$^+$) 287.1390, found 287.1393.

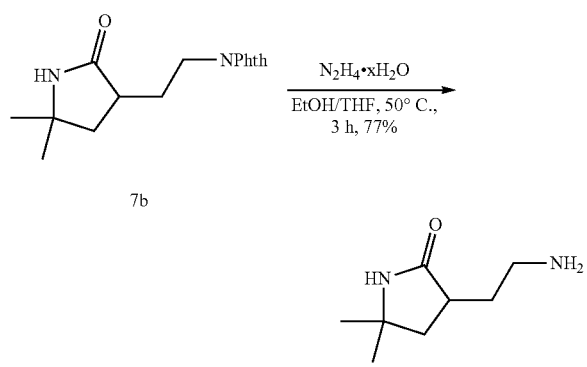

3-(2-aminoethyl)-5,5-dimethylpyrrolidin-2-one 3b 7b (9.55 g, 33.35 mmol) was dissolved in a mixture of 300 mL of THF and 300 mL of EtOH and heated to 50° C. Hydrazine hydrate (10.0 mL, ~160 mmol) was added as a neat liquid and the reaction was mechanically stirred for 3 hours, after which the reaction mixture was filtered through Celite. The filtrate was dried using anhydrous $K_2CO_3$, filtered once more, and evaporated to give crude 3b as a white solid. The solid was recrystallized from toluene to give pure 3b (4.00 g, 77%) as white needles, mp. 128° C. $^1$H NMR (500 MHz, $CDCl_3$) δ 5.91-5.81 (bs, 1H), 2.83-2.76 (m, 1H), 2.76-2.68 (m, 1H), 2.65-2.56 (m, 1H), 2.16-2.08 (m, 1H), 2.03-1.93 (m, 1H), 1.64-1.42 (m, 4H), 1.27 (s, 3H), 1.23 (s, 3H); $^{13}$C NMR (125 MHz, $CDCl_3$) δ 178.5, 54.7, 42.6, 40.5, 39.4, 35.6, 30.4, 29.1; HRMS (ESI): m/z calcd. for C8H17N2O (M+H$^+$) 157.1335, found 157.1340.

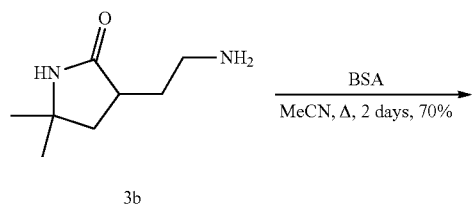

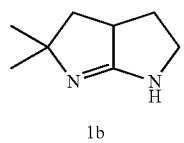

5,5-dimethyl-1,2,3,3a,4,5-hexahydropyrrolo[2,3-b]pyrrole 1b 3b (1.67 g, 10.69 mmol) was suspended in 200 mL of MeCN. Upon addition of BSA (4.35 g, 21.38 mmol), all solids quickly dissolved. The solution was refluxed for 2 days, during which the progress of the reaction was monitored by HRMS. (Note: if the reaction does not go to completion, more BSA can be added to the reaction mixture as required.) Once the reaction was complete, the reaction mixture was concentrated under reduced pressure. The remaining oil was dissolved in 40 mL of 3.0M HCl and washed with $CH_2Cl_2$ (3×100 ml), then ice was added and the solution basified with 25 mL of 10.0M NaOH, causing 1b to precipitate out of solution. The suspension was then extracted with $CH_2Cl_2$ (5×50 mL), and the extracts combined, dried using anhydrous $MgSO_4$, filtered and evaporated to provide pure 1b (1.26 g, 85%) as an off-white solid. Sublimation overnight at 70° C. gave pure, anhydrous 1b (1.03 g, 70%) as a white solid suitable for the synthesis of metal-containing ALD precursors. $^1$H NMR (500 MHz, $C_6D_6$) δ 5.40-3.90 (bs, 1H), 3.56-3.42 (m, 2H), 2.90-2.80 (m, 1H), 2.34-2.26 (m, 1H), 1.69-1.60 (m, 1H), 1.31 (s, 3H), 1.29-1.19 (m, 1H), 1.19-1.14 (s, 1H), 1.15 (s, 3H); $^{13}$C NMR (125 MHz, $C_6D_6$) δ 177.1, 71.1, 55.3, 46.9, 44.9, 31.9, 31.5, 29.0; HRMS (ESI): m/z calcd. for $C_8H_{15}N_2$ (M+H$^+$) 139.1230, found 139.1236.

Example 3. Synthesis of Unmethylated 5,5-Bicyclic Amidine, 1,2,3,3a,4,5-hexahydropyrrolo[2,3-b]pyrrole, compound 1c

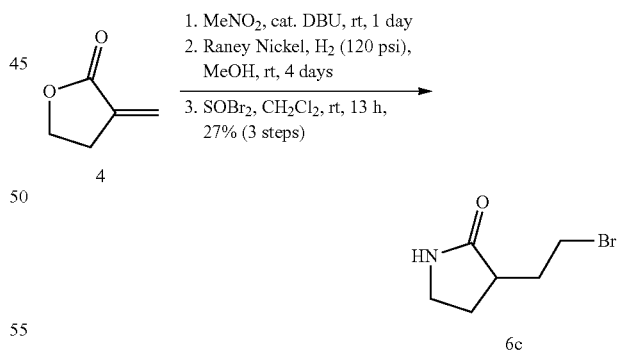

3-(2-bromoethyl)pyrrolidin-2-one 6c 5 mL of DBU was dissolved in 1 L of nitromethane, followed by 3-methylenedihydrofuran-2(3H)-one 4 (25.00 g, 254.84 mmol). This was stirred at room temperature for 1 day, then concentrated under reduced pressure at 50° C. to give a large quantity of brown oil. This oil was taken up in 250 mL of $CH_2Cl_2$ and washed with 3.0M HCl (2×250 mL), water (1×250 mL), saturated aqueous $NaHCO_3$ (1×250 mL), brine (1×250 mL), then dried using anhydrous MgSO$_4$. Filtration and subsequent evaporation gave 34.01 g of an amber oil (crude 5c) that was used without any further purification. 12.62 g (80.31 mmol) of this oil was stirred in 1.2 L of MeOH, together with 10 g of anhydrous MgSO$_4$ and 9 g of Raney Nickel that had been rinsed with 10 mL of MeOH (3×10 mL). The suspension was placed in a glass-lined Parr hydrogenator and pressurized with H$_2$ to 120 psi, then mechanically stirred for 4 days at room temperature. After release of H$_2$, the suspension was filtered through a Celite pad and volatiles removed in vacuo to give 10.27 g of a dirty yellow oil that was used without any further purification. 8.30 g (64.26 mmol) of this oil was suspended in 120 mL of CH$_2$Cl$_2$. SOBr$_2$ (16.70 g, 80.33 mmol) was carefully added as a neat liquid and the solution stirred for 13 hours, after which 300 mL of saturated Na$_2$CO$_3$ was slowly added to work up the reaction. The organic phase was isolated and the aqueous phase extracted with CH$_2$Cl$_2$ (2×150 mL). Extracts were combined and dried using anhydrous MgSO$_4$, filtered and evaporated to afford crude 6c (10.57 g, 72%) as an off-white solid that was darker brown in places. This was purified by sublimation at 110° C. and the sublimate recrystallized first from cyclohexane, then toluene to give pure 6c (3.93 g, 27%) as white needles, mp. 94-95° C. $^1$H NMR (500 MHz, CDCl$_3$) δ 6.24-6.00 (bs, 1H), 3.65-3.57 (m, 1H), 3.52-3.44 (m, 1H), 3.37-3.29 (m, 2H), 2.61-2.52 (m, 1H), 2.43-2.31 (m, 2H), 1.92-1.82 (m, 1H), 1.82-1.72 (m, 1H); $^{13}$C NMR (125 MHz, CDCl$_3$) δ 179.5, 40.5, 39.7, 34.4, 31.7, 27.9. FIRMS (ESI): m/z calcd. for C$_6$H$_{11}$BrNO (M+H$^+$) 192.0019, found 192.0016.

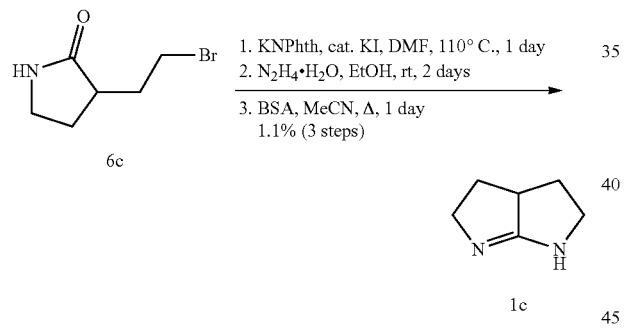

1,2,3,3a,4,5-hexahydropyrrolo[2,3-b]pyrrole 1c 6c (12.25 g, 51.61 mmol) was dissolved in 400 mL of DMF, to which potassium phthalimide (14.17 g, 76.52 mmol) and potassium iodide (2.65 g, 15.94 mmol) were added. The suspension was stirred at 110° C. for 1 day, after which most of the solvent was removed in vacuo. The remainder was taken up into 400 mL of CH$_2$Cl$_2$ and washed with water (2×400 mL) and 5% aqueous LiCl (1×400 mL, then 2×200 mL), then dried over MgSO$_4$. Filtration and evaporation gave a brown oil that slowly solidified. This was taken up into 100 mL of EtOAc and washed down through a 2.5-inch plug of silica gel with another 600 mL of EtOAc to give a yellow solution, which when evaporated afforded 5.35 g of a pale yellow solid (crude 7c) that was used without any further purification. The solid was dissolved in 300 mL of EtOH, then hydrazine monohydrate (2.07 g, 41.43 mmol) was added as a neat liquid, at which a large amount of white precipitate slowly formed. The reaction was stirred at room temperature for 2 days. The reaction mixture was filtered and most of the filtrate was evaporated under reduced pressure to give a yellow solid that consists of a mixture of phthalhydrazide and 3c (3.14 g of mixture). Owing to the high polarity and solubility of both components in water and their insolubility in organic solvents, separation of the two components was not attempted. 2.03 g of this mixture was suspended in 100 mL of MeCN. Upon addition of BSA (6.44 g, 31.68 mmol), all solids quickly dissolved. The solution was refluxed for 1 day, after which it was concentrated under reduced pressure. 40 mL of 3.0M HCl was added to the remaining oil, causing the formation of a white precipitate of phthalhydrazide. This was filtered off and the filtrate was washed with CH$_2$Cl$_2$ (3×25 ml), then ice was added and the solution basified with 25 mL of 10.0M NaOH, then finally brine (50 mL) was added. The solution was then extracted with CH$_2$Cl$_2$ (5×50 mL), and the extracts combined, dried using anhydrous MgSO$_4$, filtered and evaporated to provide crude 1c (0.26 g, 17.6%) as an off-white solid. Sublimation overnight at 80° C. gave a small amount of pure, anhydrous 1c (0.050 g, 3.4%) as a white solid suitable for the synthesis of metal-containing ALD precursors. $^1$H NMR (500 MHz, C$_6$D$_6$) δ 3.80-3.71 (m, 2H), 3.69-3.62 (m, 1H), 2.75-2.65 (m, 1H), 2.56-2.46 (m, 1H), 2.42-2.33 (m, 1H), 1.72-1.62 (m, 1H), 1.44-1.34 (m, 1H), 0.90-0.83 (m, 1H); $^{13}$C NMR (125 MHz, C$_6$D$_6$) δ 168.7, 56.4, 43.4, 39.1, 27.6, 25.5; HRMS (ESI): m/z calcd. for C$_6$H$_{11}$N$_2$ (M+H$^+$) 111.0917, found 111.0918. Note: The signal corresponding to the N—H proton, which was expected to be extremely broad (see compound 1b), was not observed by $^1$H NMR.

Example 4. Synthesis of Copper (I) 2,2,5,5-tetramethyl-1,2,3,3a,4,5-hexahydropyrrolo[2,3-b]pyrrolide 8

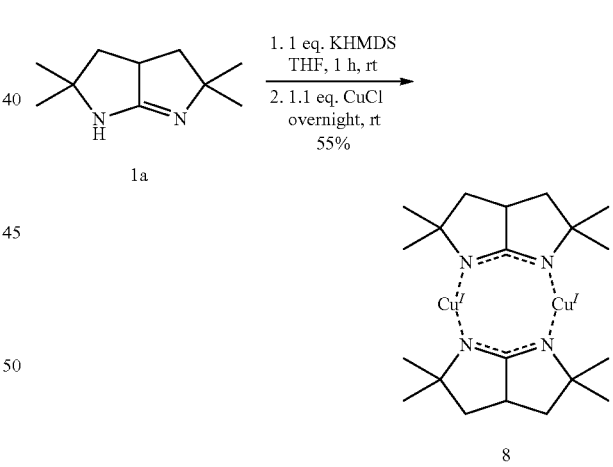

1a (2,2,5,5-tetramethyl-1,2,3,3a,4,5-hexahydropyrrolo[2,3-b]pyrrole, 100.0 mg, 0.601 mmol) was suspended in 5 mL of anhydrous THF. Potassium bis(trimethylsilyl)amide (126.3 mg, 0.633 mmol) was added, at which all solids quickly dissolved. The result was a solution of potassium 2,2,5,5-tetramethyl-1,2,3,3a,4,5-hexahydropyrrolo[2,3-b]pyrrolide. After stirring for 1 hour, copper (I) chloride (65.5 mg, 0.662 mmol) was added as a solid and the reaction allowed to continue overnight. The reaction was filtered through a Celite pad and evaporated to give an off-white solid that was thoroughly stirred with 80 mL of pentane and filtered again through Celite. Evaporation of the filtrate yielded a mixture of diastereomers of 8 (75.7 mg, 55%) as a slightly off-white solid that was recrystallized from anhydrous pentane at −30° C. to give white orthorhombic crystals suitable for single-crystal X-ray diffraction, mp. 306-307° C. (sealed capillary). Elemental Analysis calcd. for $C_{20}H_{34}Cu_2N_4$: C, 52.49%; H, 7.49%; N, 12.24%; found C, 52.18%; H, 7.42%; N, 12.60%. $^1$H NMR (500 MHz, $C_6D_6$) δ 3.27-3.17 (m, 1H), 1.75-1.68 (m, 2H), 1.35-1.26 (m, 2H), 1.28 (s, 3H), 1.27 (s, 3H), 1.11 (s, 3H), 1.10 (s, 3H); this proton NMR spectrum is plotted in FIG. 1; $^{13}$C NMR (125 MHz, $C_6D_6$) d 187.5, 187.2, 70.43, 70.42, 47.3, 47.2, 45.4, 45.2, 33.30, 33.25, 29.1, 28.9.

Figure 2:
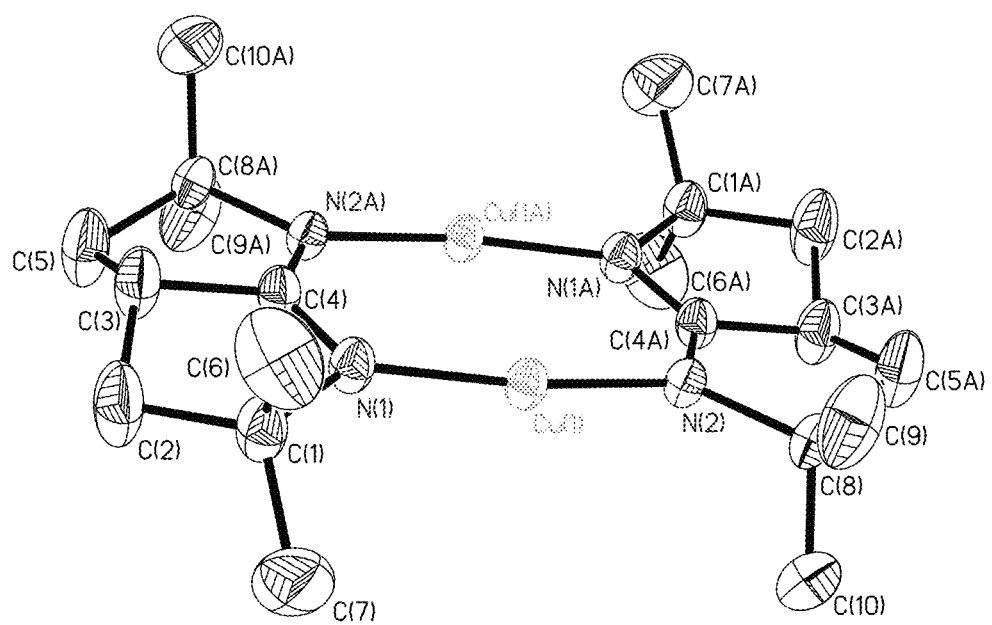
FIG. 2. X-ray crystal structure of the copper precursor shown in FIG. 1. It shows the 50% probability ellipsoids and partial atom-labeling scheme. Atoms labeled (A) are related to other atoms by an inversion center. The crystal structure has $C_{2h}$ symmetry but NMR suggests the presence of an additional diastereomer in solution, perhaps with $C_{2v}$ symmetry.

The molecular structure derived from the single-crystal X-ray analysis is shown in FIG. 2. The compound is a dimer with the two ligands bridged by two copper atoms, each placed between a pair of nitrogen atoms. The molecule has $C_{2h}$ symmetry. Small splittings in the NMR spectra suggest that in solution another diastereomer of this compound exists, presumably with $C_{2v}$ symmetry.

Figure 3:
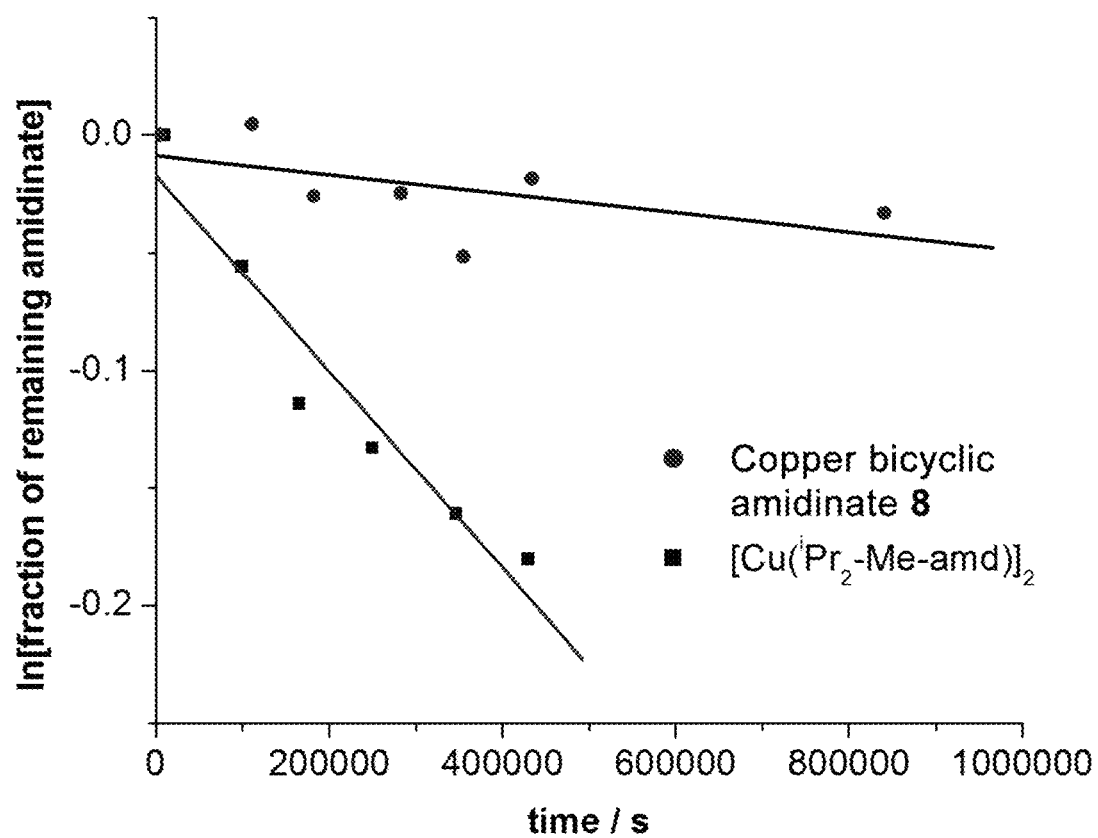
FIG. 3 Graph showing the superior thermal stability of the copper cyclic amidinate precursor, copper (I) 2,2,5,5-tetramethyl-1,2,3,3a,4,5-hexahydropyrrolo[2,3-b]pyrrolide, compared to a non-cyclic copper amidinate, copper(I) N,N'-diisopropylacetamidinate.

FIG. 3 shows the decrease in NMR intensity after a solution of the copper compound in deuterated mesitylene was heated to 200° C. for various periods of time. The exponential decay indicates a half-life of about 200 days at this temperature. For comparison, a similar NMR stability test was carried out under the same conditions with a non-bicyclic copper amidinate, whose half-life was found to be an order of magnitude shorter. These results demonstrate the superior thermal stability imparted by the bicyclic amidinate ligands of this invention.

Example 5. Synthesis of Silver (I) 2,2,5,5-tetramethyl-1,2,3,3a,4,5-hexahydropyrrolo[2,3-b]pyrrolide
9

Figure 5A:
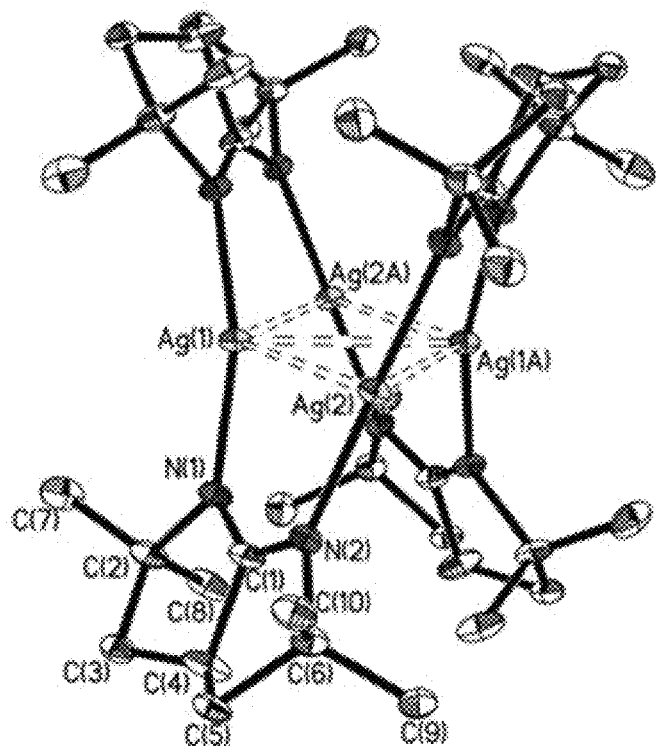
FIG. 5a) X-ray crystal structure of silver(I) 2,2,5,5-tetramethyl-1,2,3,3a,4,5-hexahydropyrrolo[2,3-b]pyrrolide, showing 35% probability ellipsoids and partial atom-labeling schemes.
Figure 5B:
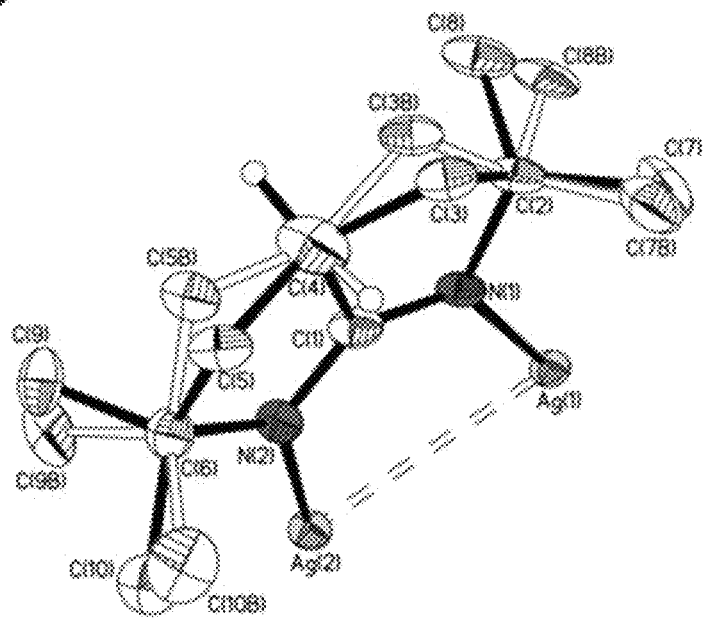
FIG. 5b) two conformations, black stick and white stick, exist in the ligands of this compound.

The potassium salt of 2,2,5,5-tetramethyl-1,2,3,3a,4,5-hexahydropyrrolo[2,3-b]pyrrole made according to Example 4, was reacted with AgOAc in diethyl ether. During the reaction, the suspension turned from grey to black, indicating the formation of some Ag$^0$ nanoparticles. The solubility of the product in THF is fairly low; therefore, a large enough quantity of THF was added to ensure that all of the product was dissolved. Filtration of the black suspension through Celite gave a clear brown solution, which upon concentration in vacuo afforded a pale-grey solid. Pentane was used to wash the solid to yield the compound (silver (I) 2,2,5,5-tetramethyl-1,2,3,3a,4,5-hexahydropyrrolo[2,3-b] pyrrolide) tetramer as a white solid in 45% yield. The proton NMR of this product is shown in FIG. 4. It has many lines because of multiple conformations of the tetrameric structure. Sublimation at 160° C. at 30 mTorr did not make the spectrum any simpler. Elemental Analysis: calcd. for $C_{40}H_{68}Ag_4N_8$: C, 43.98%; H, 6.27%; N, 10.26%; found C, 44.38%; H, 6.22%; N, 9.95%. X-ray-quality crystals were grown from hot dichloromethane solution, yielding the tetrameric X-ray structure shown in FIG. 5. The compound did not appear to react with ambient air, at least over periods of hours.

Example 6. Synthesis of Gold (I) 2,2,5,5-tetramethyl-1,2,3,3a,4,5-hexahydropyrrolo[2,3-b]pyrrolide
10

AuCl(SMe$_2$) was synthesized by the known reduction of HAuCl$_4$ by SMe$_2$. This white powder was used without further purification. The potassium salt of 2,2,5,5-tetramethyl-1,2,3,3a,4,5-hexahydropyrrolo[2,3-b]pyrrole, made according to Example 4, was reacted with AuCl(SMe$_2$) in THF. During the reaction, the suspension turned from pink to purple, indicating the formation of some gold nanoparticles. The solubility of the product in THF is fairly low; therefore, a large enough quantity of THF was added to ensure that all of the product was dissolved. Filtration of the purple suspension through Celite gave a clear solution, which upon concentration in vacuo gave a white solid. Washing with pentane afforded the compound gold (I) 2,2,5,5-tetramethyl-1,2,3,3a,4,5-hexahydropyrrolo[2,3-b] pyrrolide.

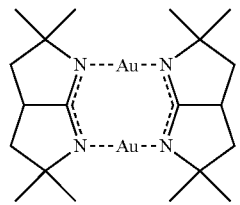

Figure 6A:
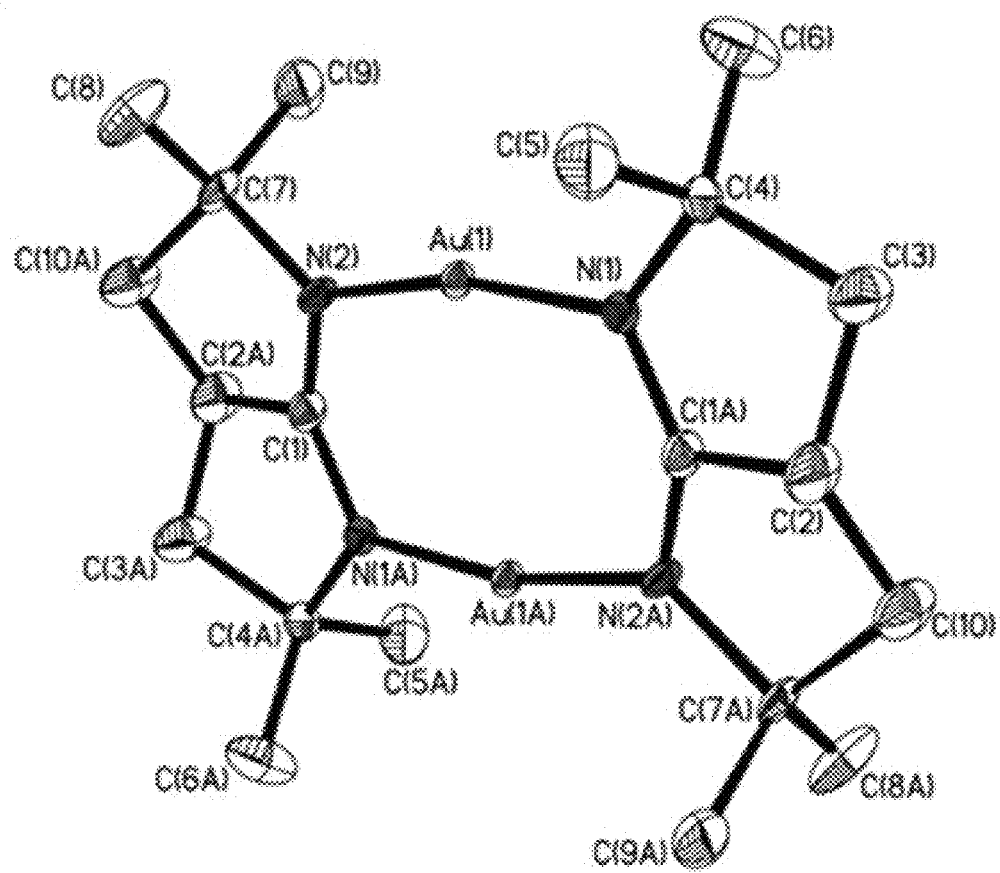
FIG. 6a) X-ray crystal structure of gold (I) 2,2,5,5-tetramethyl-1,2,3,3a,4,5-hexahydropyrrolo[2,3-b]pyrrolide, showing 50% probability ellipsoids and partial atom-labeling schemes.
Figure 6B:
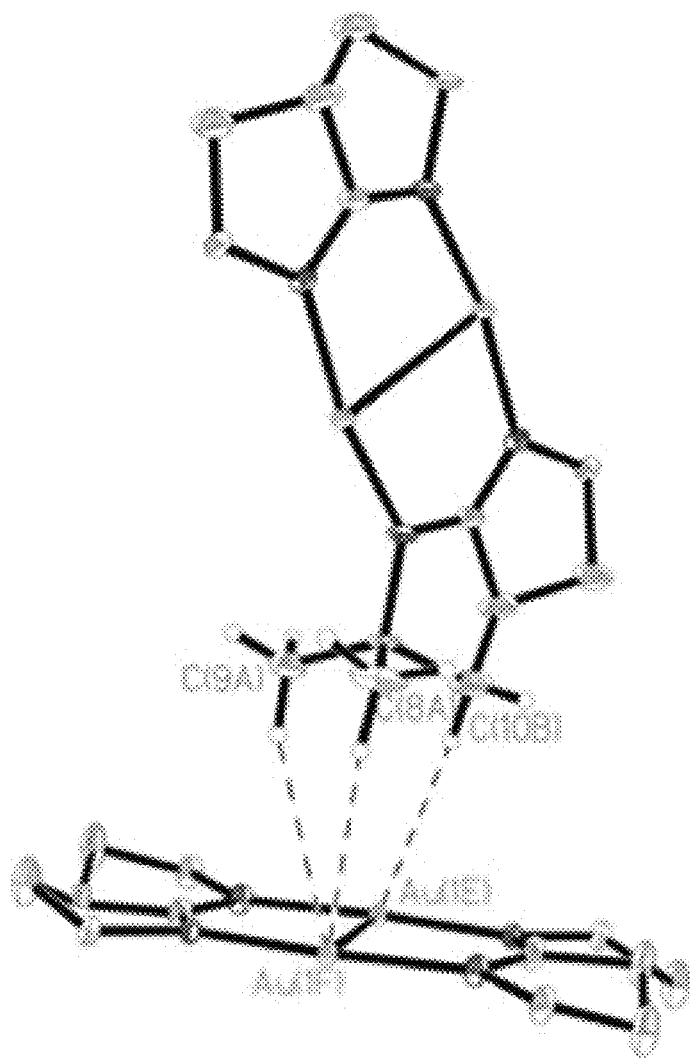
FIG. 6b) interactions between two neighboring molecules. Hydrogen atoms and some methyl groups were omitted for clarity.
Figure 7:
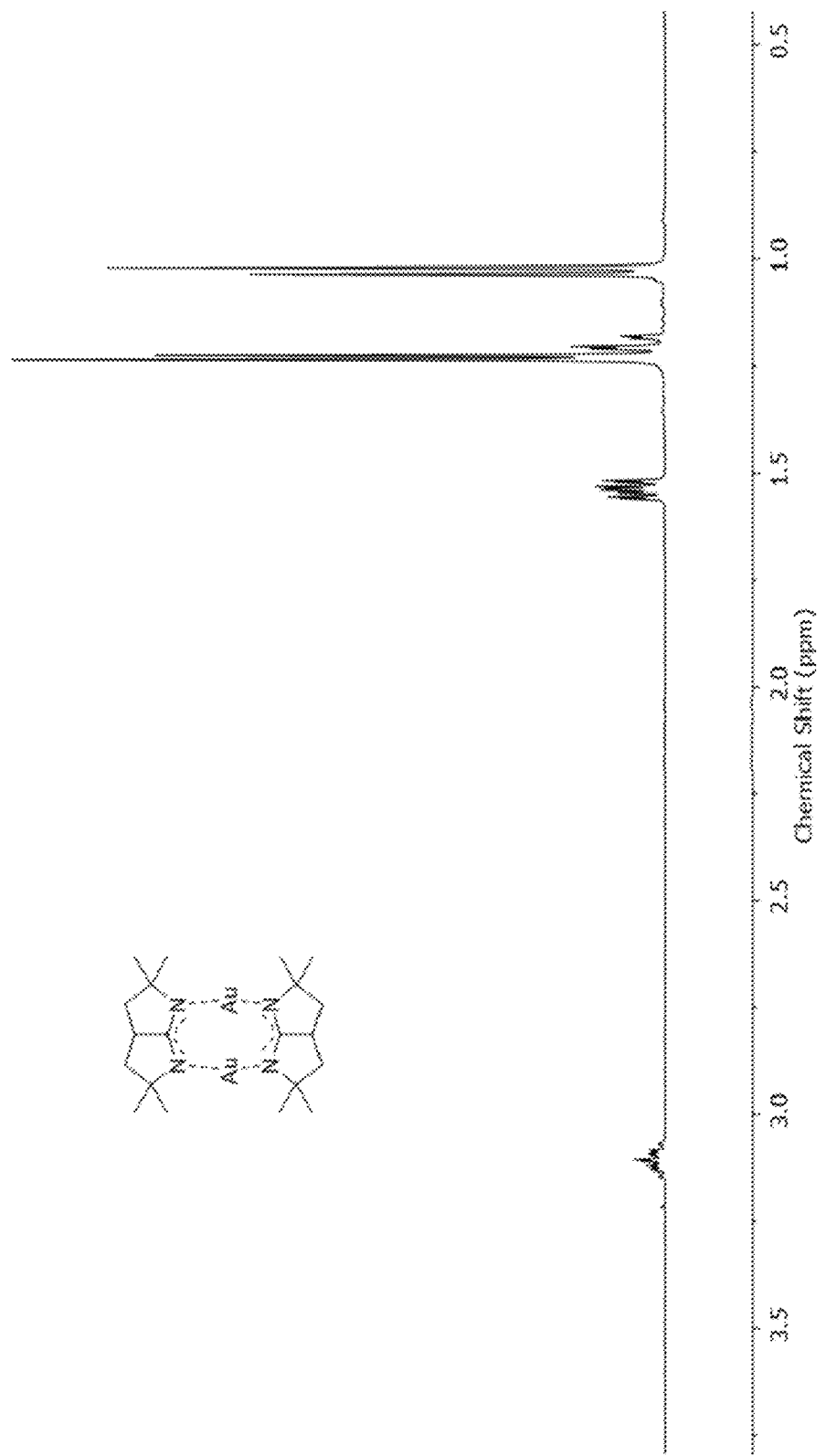
FIG. 7. Proton NMR spectrum of gold (I) 2,2,5,5-tetramethyl-1,2,3,3a,4,5-hexahydropyrrolo[2,3-b]pyrrolide. The doublets indicate the existence of two diastereomers.
Figure 8:
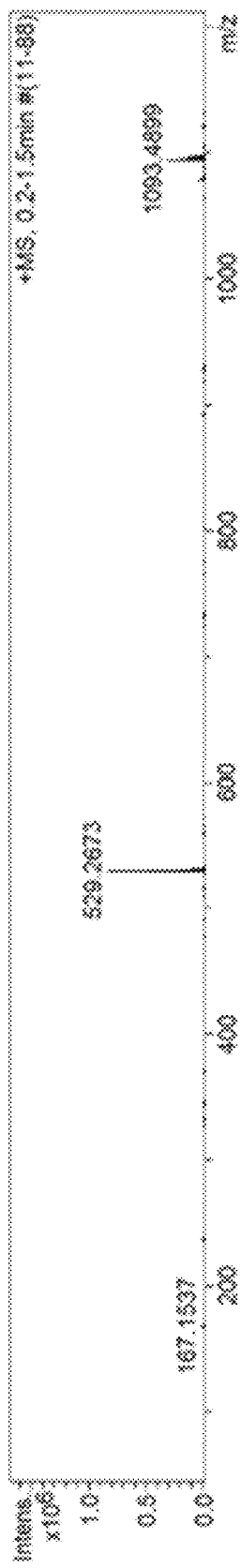
FIG. 8. Mass-spectrometry data showed the existence of free ligand (m/z=167), mono-demetalated gold (I) 2,2,5,5-tetramethyl-1,2,3,3a,4,5-hexahydropyrrolo[2,3-b]pyrrolide (m/z=529), as well as the parect peak (m/z=1093).

The crude yield was 60%, with sufficient purity to be analyzed by NMR. It was recrystallized from hot dichloromethane to give white crystals suitable for single-crystal X-ray diffraction. The dimeric molecular structure in the crystal is shown in FIG. 6. The recrystallized material may be further purified by vacuum sublimation if so desired (180° C., 30 mTorr). Elemental Analysis: calcd. for $C_{20}H_{34}Au_2N_4$: C, 33.16%; H, 4.73%; N, 7.73%; found C, 33.12%; H, 4.56%; N, 7.68%. $^1$H NMR (500 MHz, $C_6D_6$) δ 3.15-3.08 (m, 1H), 1.56-1.53 (m, 2H), 1.35-1.26 (m, 2H), 1.24-1.23 (d, 3H), 1.23-1.19 (m, 2H), 1.04-1.02 (d, 3H) (FIG. 7) A high-resolution mass spectrum (FIG. 8) showed that the dimeric structure is maintained when the molecule is vaporized. It also includes some fragments produced during the ionization. The compound did not appear to react with ambient air, at least over periods of hours.

Figure 9A:
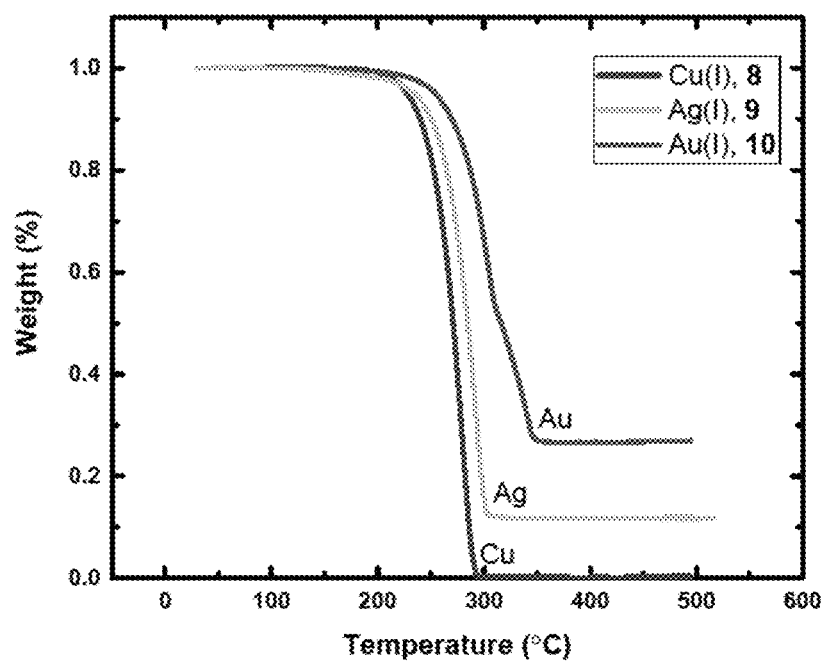
FIG. 9a) Ramped thermogravimetric analyses (TGA) of Cu(I), Ag(I), and Au(I) precursors. Linear ramp of 10° C./min was used.

In order to study the thermal stability and evaporation rate of the Cu, Ag and Au amidinate compounds, ramped thermal gravitational analyses (TGA) and stepped isothermal TGA experiments were performed on a Q50 (TA Instruments, Inc.) under 1 atm. of flowing purified N$_2$. For ramped TGA, about 10 mg of each sample was placed on an alumina pan, and the heated at a linear temperature ramp of 10° C./min. FIG. 9a shows the TGA curves of the three samples. Copper amidinate 8 sublimed cleanly starting at a temperature of ~170° C. and finishing at ~290° C., with 50% mass loss at 270° C. and <0.2% of residue. A previously reported TGA of an acyclic compound, N',N'''-diisopropyl-N,N-dimethyl-guanidinatocopper(I), under identical conditions also showed clean sublimation beginning at ~150° C., completing at ~260° C. As such, the volatility of cyclic amidinate 8 is slightly lower than that of the acyclic one, which is to be expected because of its higher molecular weight (457.61 g/mol vs. 409.57 g/mol).

TGA showed that the gold compound 10 had two weight loss curves overlapping each other, with the second curve starting at around 310° C. After heating to 500° C., the compound showed a ~25% residual, which presumably was mostly gold from the decomposed precursor. The 50% mass sublimation point was at ~310° C., about 40° C. higher than copper compound 8 which had the 50% mass loss point at 270° C. Such trend was expected as the gold compound was much heavier than copper compound (724.45 g/mol vs. 457.61 g/mol).

Figure 9B:
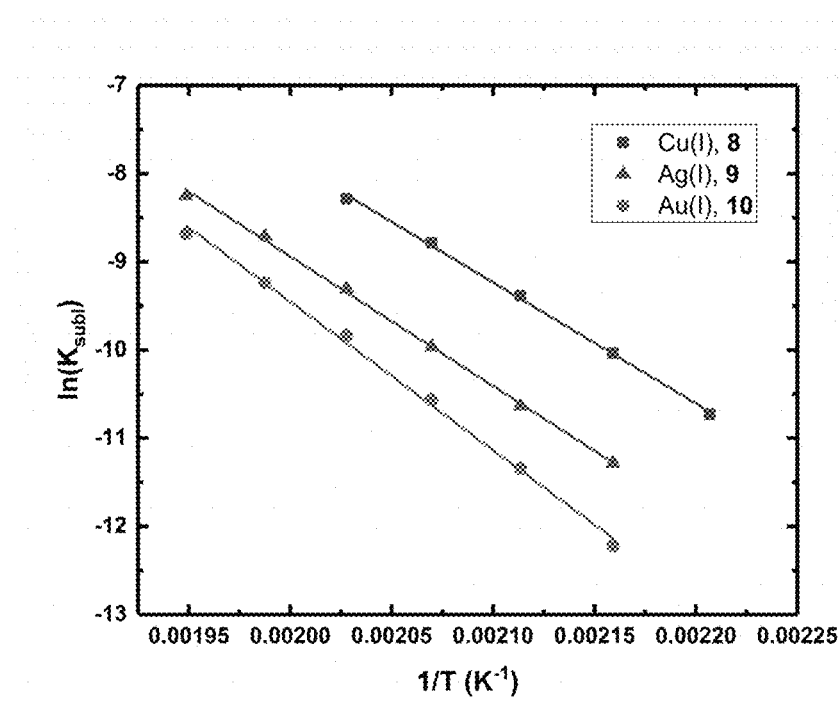
FIG. 9b) Arrhenius plot of stepped-isothermal TGA. Each temperature was held for 11 min.

More surprising was the TGA of tetrameric silver(I) compound 9. Even though X-ray analysis showed that silver compound exists as a tetramer, the silver compound had a 50% mass loss temperature at 290° C., between that of Cu(I) and Au(I) compound. This 50% mass loss temperature would only make sense if the silver was actually dimeric, rather than the heavy tetrameric complex. It is hypothesized that the tetrameric Ag(I) compound may rearrange to dimeric Ag(I) upon heating. In order to be used as a CVD precursor, the amidinate compounds need to cleanly sublime at the temperature of sublimation in the bubbler. The complicated ramped TGA curve made it difficult to judge whether there would be a sublimation-only region for this compound. Therefore, we conducted stepped-isothermal TGA. The temperature was raised at a constant rate of 10° C./min until 180° C. was reached, then maintained at 180° C. for 11 minutes. Following that, the temperature was raised successively to 240° C. in 10° C. increments at a rate of 10° C./min. The temperature was maintained for 11 minutes at each step. The curves were plotted according to Arrhenius relation: ln(rate of sublimation) vs the reciprocal of temperature in Kelvin should give a linear curve, and the slope of the curve was $-E_a/R$. It is quite evident from FIG. 9$b$ that all three compounds had a linear sublimation region below 240° C. The slope of Cu amidinate 8 is $-13731$, which corresponds to an enthalpy of sublimation of 109 kJ/mol. The slope of Ag amidinate 9 is $-14692$, which corresponds to an enthalpy of sublimation of 122 kJ/mol. The slope of Au amidinate 10 is $-16843$, which corresponds to an enthalpy of sublimation of 140 kJ/mol.

Example 7. Chemical Vapor Deposition (CVD) of Silver and Gold Metal Films

Figure 10:
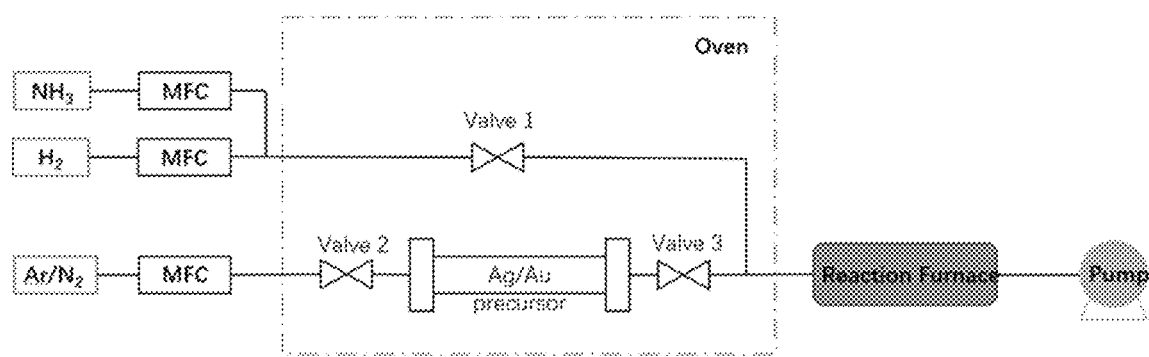
FIG. 10. Schematic drawing of the CVD reactor.
Figure 11A:
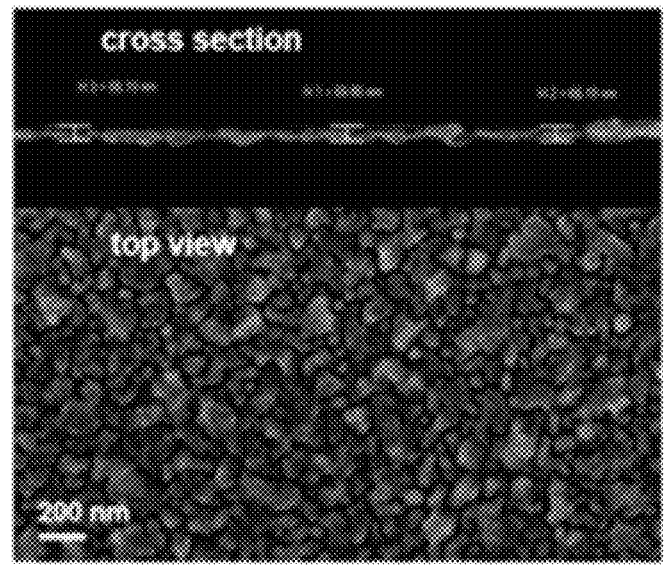
FIG. 11a) SEM image of gold film.
Figure 11B:
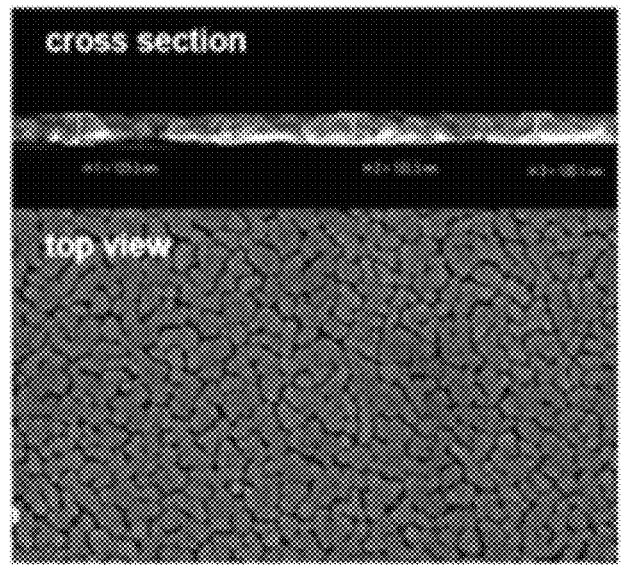
FIG. 11b) SEM image of silver film.
Figure 11C:
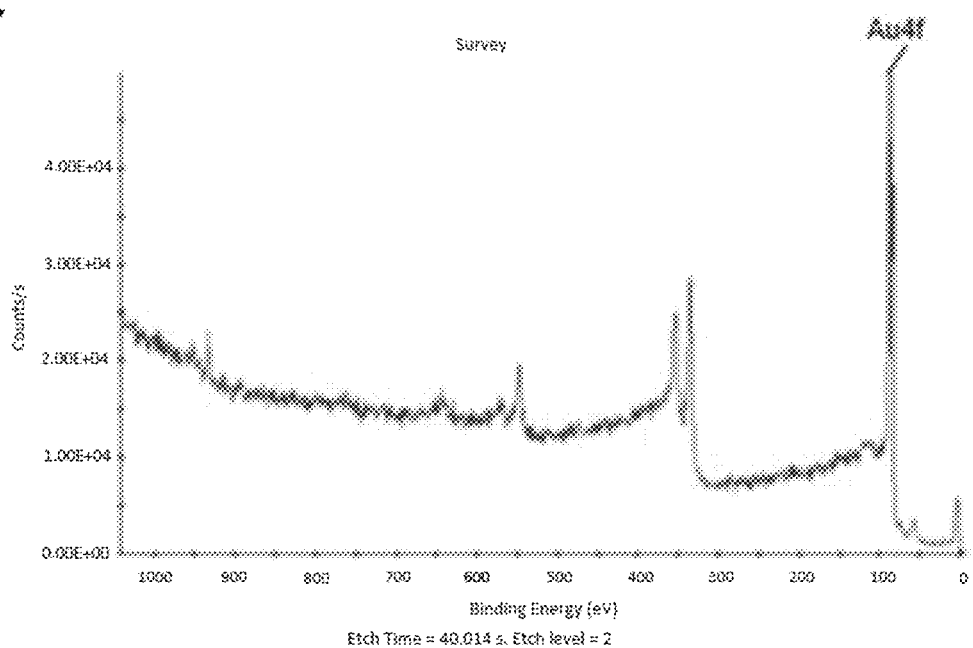
FIG. 11c) XPS analysis of gold film showed no detectable carbon content.
Figure 11D:
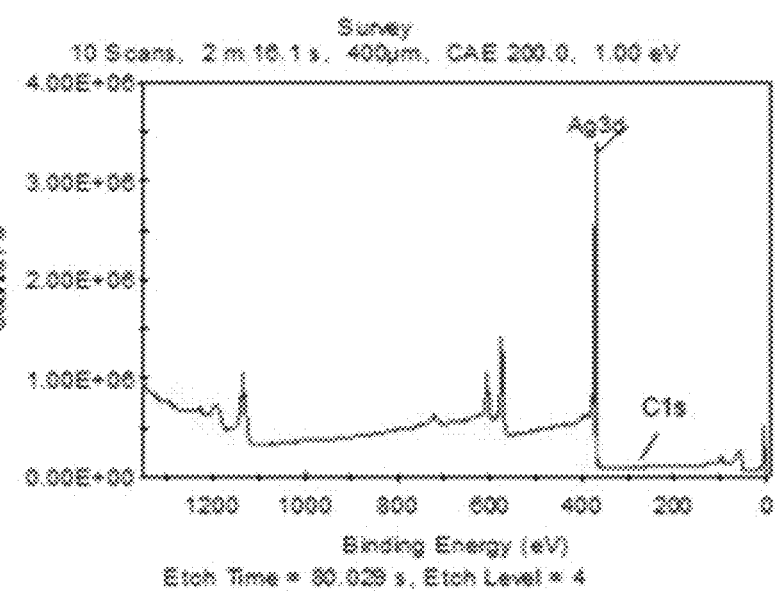
FIG. 11d) XPS analysis of silver film showed small amount of carbon content.

Vapors of silver or gold precursors were mixed with $H_2$ gas. A schematic diagram of the CVD system is shown in FIG. 10. During the deposition process, the vaporized precursor was carried with a constant flow of 100 sccm $N_2$ flow. Then the precursor vapor was mixed with purified hydrogen ($H_2$) and then delivered into a preheated reaction chamber (16 in. long and 1.25 in. diameter) with an 11 in.×1.25 in. semicylindrical sample holder inside. The total pressure in the chamber is controlled and maintained at 5 torr. The temperature of the precursor source was maintained at various values from 160-180° C. for both silver and gold deposition. The substrate temperature was held constant at 200° C. and 220° C. for Ag and Au deposition, respectively. FIGS. 11$a$ and 11$b$ demonstrate the cross-sectional and top view image of Au and Ag took by Scanning Electron Microscopy (SEM). Small crystalline grains were observed in both Au and Ag films. Film thickness and growth rate was measured and calculated through cross-sectional images. X-ray photoelectron spectroscopy (XPS) was then used to determine the elemental composition and the purity of the film. Survey scan of both Au and Ag films with best purity achieved are shown in FIGS. 11$c$ and 11$d$. The carbon content was below detection limit for Au film while 6.6 atomic percent of carbon was observed in a silver film. No oxygen peak can be detected in either Au or Ag films by XPS fine scans.

Figures 12A, 12B:
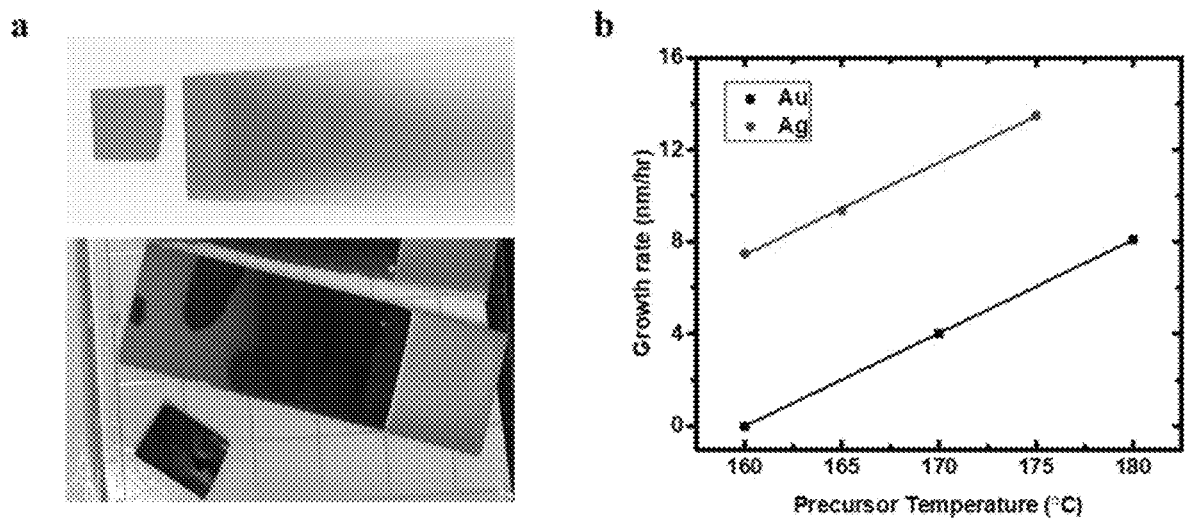
FIG. 12a) Photographs of deposited gold film (top) and silver film (bottom)
FIG. 12b) Graphs of the deposition rate of silver and gold films showing a nearly linear increase with precursor temperature.

Photographs of CVD gold and silver films are shown in FIG. 12. They both displayed metallic reflection. Positive linear relations between growth rate and the precursor temperature were observed for both Au and Ag films (FIG. 12$b$). The higher growth rate resulted from an increased vapor pressure induced by the higher precursor temperature. These data are consistent with TGA data showing that the gold precursor sublimed at a higher temperature and had a higher enthalpy of sublimation.

Control experiments were also conducted without hydrogen gas a reducing agent. No gold film was obtained without hydrogen gas as a co-reactant. A thin silver film was deposited at 230° C. due to thermal decomposition of the silver precursor. However, this silver film had ~40% carbon content by XPS and was not conductive.

Electrical resistivity was measured for both Au and Ag films by 4-point probe and Hall measurement systems. In the case of Au films, relatively constant resistivity was obtained as 245, 222, 251 Ω·nm under different deposition conditions, which is one order magnitude higher than that if bulk Au. For Ag films, resistivity ranging from 192 Ω·nm to 15000 Ω·nm was measured due to different carbon impurity levels under various deposition conditions. The purest Ag film give the lowest resistivity of 192 Ω·nm, one order magnitude higher than bulk Ag (15.9 Ω·nm). It is expected that resistivities of very thin metal films should be higher than bulk values, because of the increased electron scattering from grain boundaries and surfaces of the films.

Example 8

The potassium salt of 2,2,5,5-tetramethyl-1,2,3,3a,4,5-hexahydropyrrolo[2,3-b]pyrrole, made according to Example 4, is reacted with $SnCl_2$ in THF and then worked up as in Example 4 to obtain the compound bis(2,2,5,5-tetramethyl-1,2,3,3a,4,5-hexahydropyrrolo[2,3-b]pyrrolyl) tin(II):

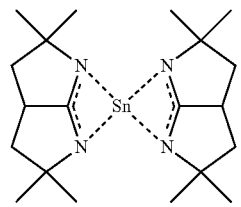

Example 9

The lithium salt of 2,2,5,5-tetramethyl-1,2,3,3a,4,5-hexahydropyrrolo[2,3-b]pyrrole was made by reacting 1a made according to Example 1 with butyllithium. This salt was then reacted with $NiCl_2$ in THF and worked up as in Example 4 to obtain the compound bis(2,2,5,5-tetramethyl-1,2,3,3a,4, 5-hexahydropyrrolo[2,3-b]pyrrolyl)nickel(II):

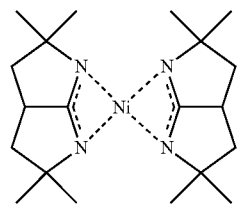

Example 10

$CoCl_2$ is reacted in THF with the lithium salt of 2,2,5,5-tetramethyl-1,2,3,3a,4,5-hexahydropyrrolo[2,3-b]pyrrole made according to Example 6 to obtain the compound bis(2,2,5,5-tetramethyl-1,2,3,3a,4,5-hexahydropyrrolo[2,3-b]pyrrolyl)cobalt(II):

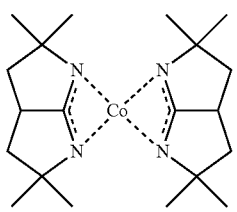

Example 11

FeCl$_2$ is reacted in THF with the lithium salt of 2,2,5,5-tetramethyl-1,2,3,3a,4,5-hexahydropyrrolo[2,3-b]pyrrole made according to Example 6 to obtain the compound bis(2,2,5,5-tetramethyl-1,2,3,3a,4,5-hexahydropyrrolo[2,3-b]pyrrolyl)iron(II):

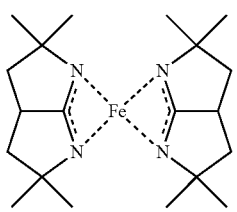

Example 12

CrCl$_2$ is reacted in THF with the lithium salt of 2,2,5,5-tetramethyl-1,2,3,3a,4,5-hexahydropyrrolo[2,3-b]pyrrole made according to Example 6 to obtain the compound bis(2,2,5,5-tetramethyl-1,2,3,3a,4,5-hexahydropyrrolo[2,3-b]pyrrolyl) chromium(II):

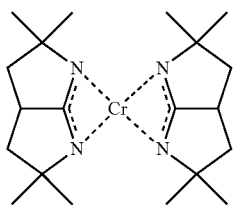

Example 13

Manganese(II) chloride, MnCl$_2$, is reacted in THF with the lithium salt of 2,2,5,5-tetramethyl-1,2,3,3a,4,5-hexahydropyrrolo[2,3-b]pyrrole made according to Example 6 to obtain the compound bis(2,2,5,5-tetramethyl-1,2,3,3a,4,5-hexahydropyrrolo[2,3-b]pyrrolyl)manganese(II):

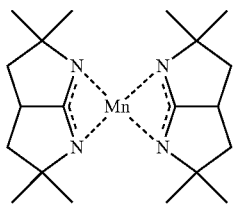

Example 14

Vanadium(II) chloride, VCl$_2$, is reacted in THF with the lithium salt of 2,2,5,5-tetramethyl-1,2,3,3a,4,5-hexahydropyrrolo[2,3-b]pyrrole made according to Example 6 to obtain the compound bis(2,2,5,5-tetramethyl-1,2,3,3a,4,5-hexahydropyrrolo[2,3-b]pyrrolyl)vanadium(II):

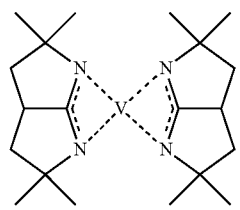

Example 15

Diethylzinc is reacted 2,2,5,5-tetramethyl-1,2,3,3a,4,5-hexahydropyrrolo[2,3-b]pyrrole made according to Example 1 to obtain the compound bis(2,2,5,5-tetramethyl-1,2,3,3a,4,5-hexahydropyrrolo[2,3-b]pyrrolyl)zinc(II):

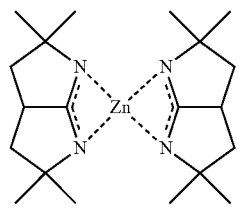

Example 16

Di-n-butylmagnesium MgBu$_2$ is reacted in THF with 2,2,5,5-tetramethyl-1,2,3,3a,4,5-hexahydropyrrolo[2,3-b]pyrrole made according to Example 1 to obtain the compound bis(2,2,5,5-tetramethyl-1,2,3,3a,4,5-hexahydropyrrolo[2,3-b]pyrrolyl)magnesium(II):

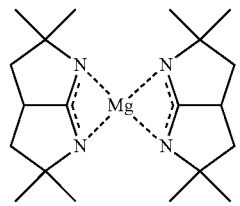

Example 17

Dichlorotricabonylruthenium(II) dimer, [RuCl$_2$(CO)$_3$]$_2$, is reacted in THF with the lithium salt of 2,2,5,5-tetramethyl-1,2,3,3a,4,5-hexahydropyrrolo[2,3-b]pyrrole made according to Example 6 to obtain the compound bis(2,2,5,5-tetramethyl-1,2,3,3a,4,5-hexahydropyrrolo[2,3-b]pyrrolyl)ruthenium(II) dicarbonyl:

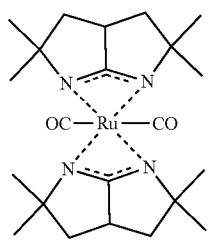

Example 18

Calcium metal is dissolved in liquid ammonia at −78° C. 2,2,5,5-Tetramethyl-1,2,3,3a,4,5-hexahydropyrrolo[2,3-b]pyrrole made according to Example 1 is dissolved in tetrahydrofuran (THF) and cooled to −78° C., and this THF solution is added to the calcium solution. Warming the reaction mixture to room temperature and evaporating ammonia and THF leaves the compound bis(2,2,5,5-tetramethyl-1,2,3,3a,4,5-hexahydropyrrolo[2,3-b]pyrrolyl)calcium (II):

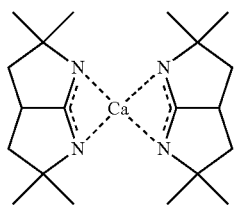

Example 19

Strontium metal is dissolved in liquid ammonia at −78° C. 2,2,5,5-Tetramethyl-1,2,3,3a,4,5-hexahydropyrrolo[2,3-b]pyrrole made according to Example 1 is dissolved in THF and cooled to −78° C., and this THF solution is added to the strontium solution. Warming the reaction mixture to room temperature and evaporating ammonia and THF leaves the compound bis(2,2,5,5-tetramethyl-1,2,3,3a,4,5-hexahydropyrrolo[2,3-b]pyrrolyl)strontium(II):

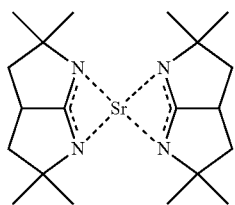

Example 20

Barium metal is dissolved in liquid ammonia at −78° C. 2,2,5,5-Tetramethyl-1,2,3,3a,4,5-hexahydropyrrolo[2,3-b]pyrrole made according to Example 1 is dissolved in THF and cooled to −78° C., and this THF solution is added to the barium solution. Warming the reaction mixture to room temperature and evaporating ammonia and THF leaves the compound bis(2,2,5,5-tetramethyl-1,2,3,3a,4,5-hexahydropyrrolo[2,3-b]pyrrolyl)barium(II):

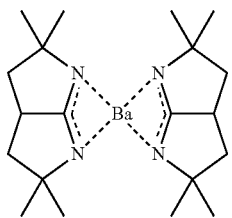

Example 21

$CrCl_3$ is reacted with the lithium salt of 1,2,3,3a,4,5-hexahydropyrrolo[2,3-b]pyrrolyl made according to Example 3 to form tris(1,2,3,3a,4,5-hexahydropyrrolo[2,3-b]pyrrolyl)chromium(III):

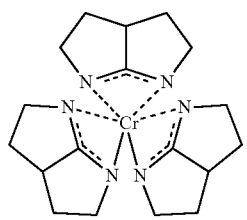

Example 22

$TiCl_3$ is reacted with the lithium salt of 1,2,3,3a,4,5-hexahydropyrrolo[2,3-b]pyrrolyl made according to Example 3 to form tris(1,2,3,3a,4,5-hexahydropyrrolo[2,3-b]pyrrolyl)titanium(III):

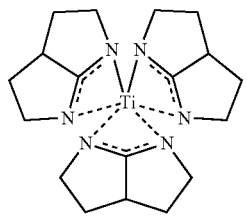

Example 23

$RuCl_3(Me_2S)_3$ is reacted with 1,2,3,3a,4,5-hexahydropyrrolo[2,3-b]pyrrolyl lithium to form tris(1,2,3,3a,4,5-hexahydropyrrolo[2,3-b]pyrrolyl)ruthenium(III):

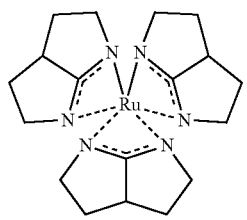

Example 24

ScCl₃ is reacted with 2,2-dimethyl-1,2,3,3a,4,5-hexahydropyrrolo[2,3-b]pyrrolyl lithium made according to Example 2 to form tris(2,2-dimethyl-1,2,3,3a,4,5-hexahydropyrrolo[2,3-b]pyrrolyl)scandium(III):

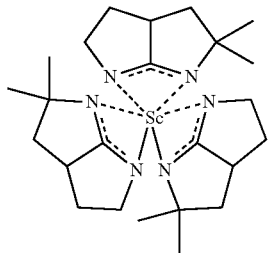

Example 25

Sb(NMe₂)₃ is reacted with 2,2-dimethyl-1,2,3,3a,4,5-hexahydropyrrolo[2,3-b]pyrrole to form tris(2,2-dimethyl-1,2,3,3a,4,5-hexahydropyrrolo[2,3-b]pyrrolyl)antimony(III):

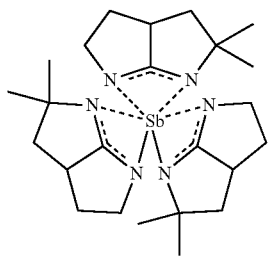

Example 26

LuCl₃ is reacted with 2,2-dimethyl-1,2,3,3a,4,5-hexahydropyrrolo[2,3-b]pyrrolyl lithium made according to Example 2 to form tris(2,2-dimethyl-1,2,3,3a,4,5-hexahydropyrrolo[2,3-b]pyrrolyl)lutetium(III):

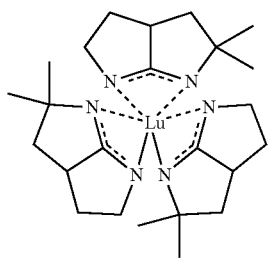

Example 27

WCl₃(pyridine)₃ is reacted with 2,2-dimethyl-1,2,3,3a,4,5-hexahydropyrrolo[2,3-b]pyrrolyl lithium made according to Example 2 to form tris(2,2-dimethyl-1,2,3,3a,4,5-hexahydropyrrolo[2,3-b]pyrrolyl)tungsten(III):

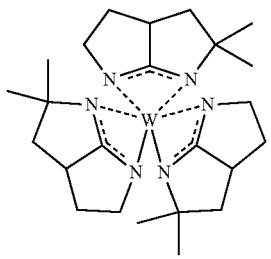

Example 28

YCl₃ is reacted with 2,5-dimethyl-1,2,3,3a,4,5-hexahydropyrrolo[2,3-b]pyrrolyl lithium to form tris(2,5-dimethyl-1,2,3,3a,4,5-hexahydropyrrolo[2,3-b]pyrrolyl)yttrium(III):

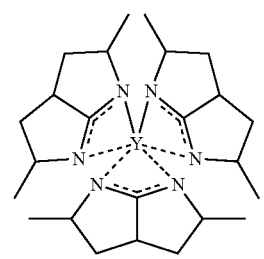

Example 29

GdCl₃ is reacted with 2,5-dimethyl-1,2,3,3a,4,5-hexahydropyrrolo[2,3-b]pyrrolyl lithium to form tris(2,5-dimethyl-1,2,3,3a,4,5-hexahydropyrrolo[2,3-b]pyrrolyl)gadolinium(III):

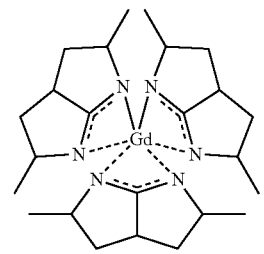

Example 30

LaCl₃(THF)₃ is reacted with 2,5-dimethyl-1,2,3,3a,4,5-hexahydropyrrolo[2,3-b]pyrrolyl lithium to form tris(2,5-dimethyl-1,2,3,3a,4,5-hexahydropyrrolo[2,3-b]pyrrolyl)lanthanum(III):

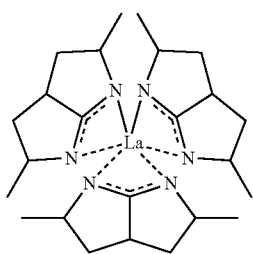

Example 31

LaCl$_3$(THF)$_3$ is reacted with 2,2,5,5-tetramethyl-1,2,3,3a,4,5-hexahydropyrrolo[2,3-b]pyrrolyl lithium made according to Example 1 to form tris(2,2,5,5-tetramethyl-1,2,3,3a,4,5-hexahydropyrrolo[2,3-b]pyrrolyl) lanthanum(III):

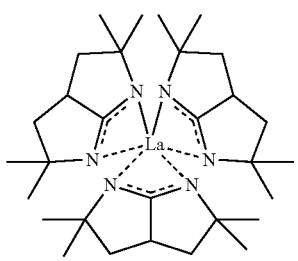

Example 32

2,2,5,5-tetramethyl-1,2,3,3a,4,5-hexahydropyrrolo[2,3-b]pyrrole is made according to Example 1 and reacted with butyllithium to form 2,2,5,5-tetramethyl-1,2,3,3a,4,5-hexahydropyrrolo[2,3-b]pyrrolyllithium. BiCl$_3$ is reacted with the 2,2,5,5-tetramethyl-1,2,3,3a,4,5-hexahydropyrrolo[2,3-b]pyrrolyllithium to form tris(2,2,5,5-tetramethyl-1,2,3,3a,4,5-hexahydropyrrolo[2,3-b]pyrrolyl)bismuth(III):

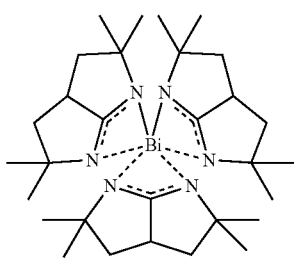

Example 33

Hf(NMe$_2$)$_4$ is reacted with 1,2,3,3a,4,5-hexahydropyrrolo[2,3-b]pyrrole made according to Example 3 to form tetrakis(1,2,3,3a,4,5-hexahydropyrrolo[2,3-b]pyrrolyl)hafnium (IV):

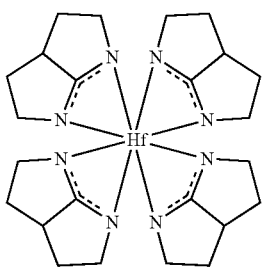

Example 34

Zr(NMe$_2$)$_4$ is reacted with 1,2,3,3a,4,5-hexahydropyrrolo[2,3-b]pyrrole made according to Example 3 to form tetrakis(1,2,3,3a,4,5-hexahydropyrrolo[2,3-b]pyrrolyl)zirconium (IV):

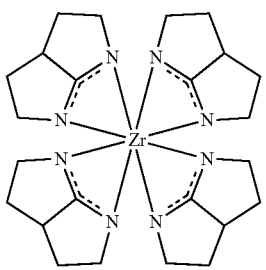

These compounds are useful for the synthesis of materials containing metals. Examples include pure metals, metal alloys, metal oxides, metal nitrides, metal phosphides, metal sulfides, metal borides, metal silicides and metal germanides. Techniques for materials synthesis include vapor deposition (CVD and ALD), liquid solution methods (sol-gel and precipitation) and solid-state pyrolysis.

Those skilled in the art will recognize or be able to ascertain using no more than routine experimentation, many equivalents to the specific embodiments of the invention described specifically herein. Such equivalents are intended to be encompassed within the scope of the following claims.

What is claimed is:

1. A metal bicyclic amidinate comprising one or more metals and one or more bicyclic amidinate ligands with the general structure

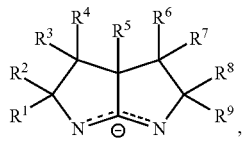

wherein $R^1$, $R^2$, $R^3$, $R^4$, $R^5$, $R^6$, $R^7$, $R^8$, and $R^9$ are each independently selected from the group consisting of hydrogen, hydrocarbon groups, substituted hydrocarbon groups, and other groups of non-metallic atoms, and wherein the one or more bicyclic amidinate ligands are bonded to the one or more metals.

2. The metal bicyclic amidinate of claim 1, being a metal(I) bicyclic amidinate represented either by the general formula for dimers

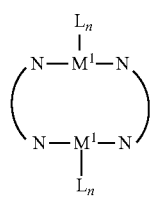

or by oligomers of the same monomeric unit, wherein:

M$^1$ represents the one or more metals and is a metal(I) selected from the group consisting of copper, silver, gold, iridium, thallium, lithium, sodium, and potassium;

represents the one or more bicyclic amidinate ligands with the general structure

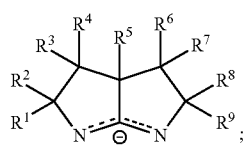

and

L$_n$ represents a neutral donor ligand present in amounts n=0, 1, 2 or more.

3. The metal bicyclic amidinate of claim 2, having the chemical name 2,2,5,5-tetramethyl-1,2,3,3a,4,5-hexahydropyrrolo[2,3-b]pyrrolyl copper(I) dimer and having the formula:

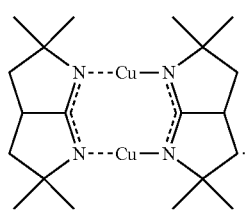

4. The metal bicyclic amidinate of claim 2, having the chemical name 2,2,5,5-tetramethyl-1,2,3,3a,4,5-hexahydropyrrolo[2,3-b]pyrrolyl silver(I) tetramer and having the formula:

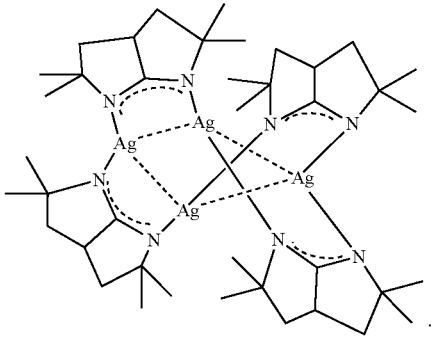

5. The metal bicyclic amidinate of claim 2, having the chemical name 2,2,5,5-tetramethyl-1,2,3,3a,4,5-hexahydropyrrolo[2,3-b]pyrrolyl gold(I) dimer and having the formula:

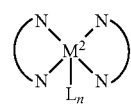

6. The metal bicyclic amidinate of claim 1, being a metal(II) bis(bicyclic amidinate) represented either by the general formula

or by its oligomers, wherein:

M$^2$ represents the one or more metals and is a metal(II) selected from the group consisting of nickel, cobalt, chromium, iron, beryllium, magnesium, copper, zinc, titanium, vanadium, platinum, palladium, manganese, ruthenium, tin, cadmium, calcium, europium, strontium, lead, barium, and tellurium;

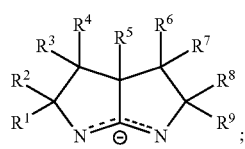

represents the one or more bicyclic amidinate ligands with the general structure

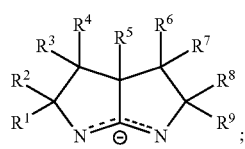

and

L$_n$ represents a neutral donor ligand present in amounts n=0, 1, 2 or more.

7. The metal bicyclic amidinate of claim 6, having the chemical name bis(3a-ethyl-2,2-dimethyl-1,2,3,3a,4,5-hexahydropyrrolo[2,3-b]pyrrolyl)nickel(II) and having the formula:

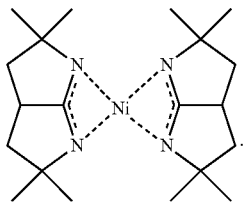

8. The metal bicyclic amidinate of claim 6, having the chemical name bis(2,2,5,5-tetramethyl-1,2,3,3a,4,5-hexahydropyrrolo[2,3-b]pyrrolyl)ruthenium(II) dicarbonyl and having the formula:

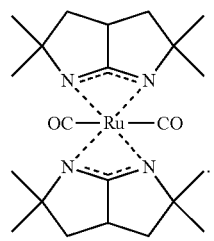

9. The metal bicyclic amidinate of claim 1, being a metal(III) tris(amidinate) represented either by the general formula

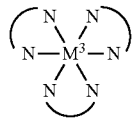

or by its oligomers, wherein:

$M^3$ represents the one or more metals and is a metal(III) selected from the group consisting of aluminum, cobalt, iron, chromium, gallium, vanadium, titanium, rhodium, ruthenium, osmium, iridium, molybdenum, tungsten, niobium, tantalum, scandium, antimony, indium, lutetium, ytterbium, thulium, erbium, thallium, yttrium, holmium, dysprosium, terbium, gadolinium, europium, samarium, neodymium, praseodymium, cerium, lanthanum, bismuth, and uranium; and

represents the one or more bicyclic amidinate ligands with the general structure

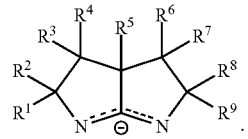

10. The metal bicyclic amidinate of claim 9, having the chemical name tris(2, 5-dimethyl-1,2,3,3a,4,5-hexahydropyrrolo[2,3-b]pyrrolyl)lanthanum(III) and having the formula:

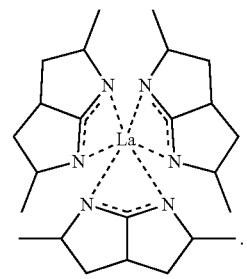

11. The metal bicyclic amidinate of claim 1, being a metal(IV) tetrakis(bicyclic-amidinate) represented either by the general formula

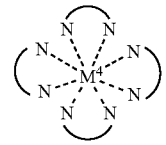

or by its oligomers, wherein:

$M^4$ represents the one or more metals and is a metal(IV) selected from the group consisting of zirconium, hafnium, tin, tantalum, niobium, tungsten, molybdenum, uranium, rhenium, platinum, osmium, iridium, ruthenium, palladium, titanium, rhodium, vanadium, tellurium, cerium, and lead; and

represents the one or more bicyclic amidinate ligands with the general structure

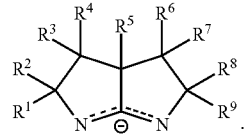

12. The metal bicyclic amidinate of claim 11, having the chemical name tetrakis(1,2,3,3a,4,5-hexahydropyrrolo[2,3-b]pyrrolyl) metal(IV) and having the formula:

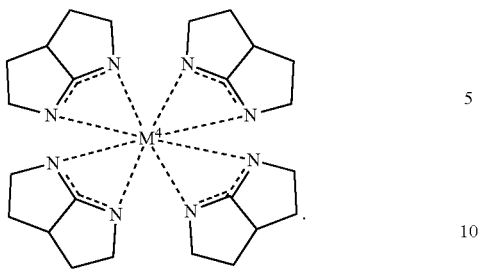
13. The metal bicyclic amidinate of claim 12, wherein $M^4$ is zirconium or hafnium.
* * * * *